United States Patent
Toya et al.

(10) Patent No.: US 6,407,371 B1
(45) Date of Patent: Jun. 18, 2002

(54) HEATER

(75) Inventors: Eiichi Toya; Tomio Konn; Tomohiro Nagata; Norihiko Saito; Shigeru Yamamura, all of Oguni-machi; Ken Nakao, Sagamihara; Takanori Saito, Sagamihara; Hisaei Osanai, Sagamihara; Toshiyuki Makiya, Tokyo, all of (JP)

(73) Assignees: Toshiba Ceramics Co., Ltd.; Tokyo Electron Limited, both of Tokyo (JP)

( * ) Notice: Subject to any disclaimer, the term of this patent is extended or adjusted under 35 U.S.C. 154(b) by 0 days.

(21) Appl. No.: 09/451,868

(22) Filed: Dec. 1, 1999

(30) Foreign Application Priority Data

Dec. 1, 1998 (JP) .......................................... 10-356935

(51) Int. Cl.$^7$ ................................................ H05B 3/10
(52) U.S. Cl. ........................ 219/553; 219/552; 219/541; 219/411; 219/534; 338/222; 118/724; 118/725
(58) Field of Search ................................. 219/534, 544, 219/552, 553, 411, 541; 338/322; 118/724, 725

(56) References Cited

U.S. PATENT DOCUMENTS

| | | | | |
|---|---|---|---|---|
| 3,346,723 A | * | 10/1967 | Mohn et al. ................. | 219/553 |
| 4,125,761 A | * | 11/1978 | Churchill ..................... | 219/544 |
| RE30,126 E | * | 10/1979 | Churchill ..................... | 219/544 |
| 4,812,626 A | * | 3/1989 | Strada ......................... | 219/523 |
| 5,083,012 A | * | 1/1992 | Edwards ...................... | 219/553 |
| 5,408,071 A | * | 4/1995 | Ragland et al. .............. | 219/530 |
| 5,575,941 A | * | 11/1996 | Johnson ....................... | 219/544 |
| 5,907,663 A | * | 5/1999 | Lee .............................. | 392/407 |
| 6,061,500 A | * | 5/2000 | Su ............................... | 392/498 |

FOREIGN PATENT DOCUMENTS

WO    WO 94/28693    12/1994

OTHER PUBLICATIONS

Patent Abstracts of Japan, Application No. 10–254513 (Jul. 30, 1998), Eiichi Sotodani et al., "Carbon Heater", (Publication No. 2000–021890; Jan. 21, 2000), 1 page.

* cited by examiner

*Primary Examiner*—Teresa Walberg
*Assistant Examiner*—Shawntina T. Fuqua
(74) *Attorney, Agent, or Firm*—Foley & Lardner

(57) ABSTRACT

A rod-shaped heater provided is composed of a carbon wire heating element 2 sealed in a small or large diameter quartz glass tube, a small diameter quartz glass tube portions 3a and 3b charged with compressed wire carbon members at opposite ends thereof; a sealed terminal section 10 having connection lines 11a and 11b for power supply held between the compressed wire carbon members charged in the small diameter quartz glass tube. The connection lines and the carbon wire heating element are electrically connected by way of the wire carbon members. This rod-shaped heater using the carbon wire heating element is suitable for readily raising the temperature of the agent in the storage tank of the wet etching agent or the grinding agent.

16 Claims, 14 Drawing Sheets

(a)

(b)

(a)

(b)

(a)

(b)

(c)

(d)

// HEATER

BACKGROUND OF THE INVENTION

The present invention relates to a heater and, more particularly, to a rod-shaped heater or a plate-like heater which uses a carbon wire heating element with a quartz glass member, sealed therein.

In various heat treatment atmosphere in oxidation, diffusion or chemical vapor deposition (CVD) treatments conducted in the semiconductor manufacturing process, a strict temperature control is required.

Further, in the semiconductor manufacturing process, a strict temperature control is also required for a wet etching agent, a grinding agent or the like as used in other cleaning or grinding processes.

For this temperature control in such processes, a rod-shaped heater or a plate-like heater is widely used.

As an example of such heaters, there has been proposed a heater which has a heating element made of tungsten material, the outside of said heating element being covered by a quartz glass tube.

Since such a rod-shaped heater or a plate-like heater is directly dipped in a storage tank which stores a wet etching agent, a grinding agent or the like, there is a technical problem left unsolved that once the quartz glass tube covering the heating element should break, said wet etching agent or said grinding agent will be subjected to metallic contamination, leading to contamination of the wafers which are going to be ground or cleaned.

Even if said quartz glass tube is not broken, there still is a gradual metallic contamination of the wet etching agent or the grinding agent by way of the quartz glass heater from said heating element.

The inventors have already proposed in Japanese Patent Application No. 10-254513 a heater for semiconductor manufacturing which employs a carbon wire heating element that may be used advantageously as compared to said metallic heating element.

Said carbon wire heating element is manufactured by binding very fine carbon filaments into a carbon fiber bundle and weaving a plurality of such carbon fiber bundles, Said carbon wire heating element have a small heat capacity as to provide an excellent temperature rising and decreasing characteristics as compared to the conventional metallic heating element and an excellent heat resistance in a non-oxidizing atmosphere.

Further, since a plurality of fine carbon filaments are woven into carbon fiber bundles, the thus manufactured carbon wire heating element has advantages such as more flexibility than a heating element of a solid carbon material and it is easy to work the material into various structure or shapes.

SUMMARY OF THE INVENTION

The present invention is made to solve the above mentioned technical problem which the rod-shaped heater or a plate-like heater conventionally faces by use of said carbon wire heating element and its objective is to provide a heater suited to raise the temperature of the wet etching agent, the grinding agent or the like by dipping directly into the storage tank.

Particularly, the present invention has it an objective to provide a heater which can prevent the metallic contamination of the wet etching agent, the grinding agent or the like, and which has a mechanical strength against any breakage in the event of direct dipping into the storage tank of the wet etching agent or the grinding agent.

In order to solve the above mentioned technical problem, the present invention essentially provides in one aspect thereof a heater comprising a large diameter glass tube; a carbon wire heating element sealed in said large diameter glass tube and having opposite ends; a small diameter glass tube charged with compressed wire carbon members at opposite ends thereof, said compressed wire carbon members tightly holding said opposite ends of the carbon wire heating element therebetween; and a sealed terminal section having connection lines for power supply held between said carbon wire material, said connection lines and said carbon wire heating element being electrically connected to each other by way of said wire carbon members.

Also in order to solve the above mentioned technical problem, the present invention essentially provides in another aspect thereof, a heater comprising a carbon wire heating element having opposite ends; a small diameter glass tube charged with compressed wire carbon members at opposite ends thereof, said compressed wire carbon materials tightly holding said opposite ends of the carbon wire heating element therebetween such that said small diameter glass seals carbon wire heating element therein; and a sealed terminal section having connection lines for power supply held between said carbon wire material, said connection lines and said carbon wire heating element being electrically connected to each other by way of said wire carbon members.

In this connection, it is preferable that said large diameter glass tube and said small diameter glass tube are formed of quartz glass.

In order to solve the above mentioned technical problem, the present invention essentially provides in a further aspect thereof, a heater a plate-like glass member; a carbon wire heating element sealed in said plate-like glass member and having opposite ends; a small diameter glass tube section charged with compressed wire carbon members, said compressed wire carbon members tightly holding said opposite ends of the carbon wire heating elements therebetween; and a sealing terminal section having connection lines for power supply held between said carbon wire members, said connection lines and said carbon wire heating element being electrically connected to each other by way of said wire carbon members.

Thus, the present invention relating to the heater is characterized in that the connection lines are held in a compressed manner between the wire carbon members. Therefore, the carbon contents of the wire carbon performs a reducing reaction to prevent the connection lines from being oxidized with the result that any generation of sparks accompanying the oxidation of the connection lines.

Further, since the carbon wire heating elements and the connection lines are attached to the wire carbon members at their compressed portions, the connection are prevented from becoming loose due to the high temperature of the carbon wire heating element, thus assuring a good electrical connection.

Further, since the carbon wire heating element is used, a wet etching agent, a grinding agent or the like is prevented from metallic contamination spreading by way of the glass tube from the heating element.

It is preferable that said aid wire carbon members and said carbon wire heating element are held in a compressed state to extend substantially in parallel to an axis of said small diameter quartz glass tube section.

Further, it is preferable that each of said wire carbon members and said carbon wire heating element is prepared by binding a plurality of carbon fibers into a carbon fiber bundle and weaving a plurality of such carbon fiber bundles into a knitted cord or a braid.

In this way, since said wire carbon members and said carbon wire heating element are accommodated in parallel to the axis of the small diameter glass tube in a compressed state, the connection between said wire carbon members and said carbon wire heating element will not become loose, thus assuring a good electrical connection.

Particularly, said wire carbon members and said carbon wire heating element which are composed of knitted cords or braids woven from a plurality of fiber bundles each of which is prepared by binding carbon fibers have elasticity in the direction of the small diameter glass tube to assure a positive retention of the connection lines without the likelihood of becoming loose with the result that a good electrical connection is maintained.

It is preferable that said small diameter glass tube section accommodates one or more carbon wire heating elements therein and is charged with a plurality of wire carbon members and it is also preferable that said wire carbon members and said carbon wire heating elements are formed of an identical material to each other, the number of said wire carbon members is five times or more that of said carbon wire heating elements.

In this way, in the event the number of the wire carbon members are equal to or more than the number of the carbon wire elements, the heat from the wire carbon materials may be lowered.

Also, since the interposition of the wire carbon members between the carbon wire heating element and the connection lines minimizes the conduction of the heat from the carbon wire heating element, thus preventing the degradation of the sealing terminal section due to the high temperature.

Particularly, in the event that the number of the wire carbon members is five or more times the number of said carbon wire heating element, a remarkable effect results.

It is preferable that said sealing terminal section is composed of a glass tube including a glass portion, a graded seal portion, and a tungsten glass portion, said connection lines being pinch sealed at a pinch sealed portion, said glass portion being fused to said large diameter glass tube.

Since the glass tube constituting the sealing terminal section is thus composed, the structure of the sealing terminal section is simplified, the number of parts and man hours involved are reduced. Further, The glass tube to be integrate through fusion to a large diameter glass tube includes, taken from the glass the large diameter glass tube side, the glass portion, the graded seal portion and a tungsten glass portion, the damage thereto at a high temperature is prevented.

It is also preferable that said sealing terminal section is composed of internal connection lines electrically connected to said carbon wire heating element; external connection lines for power supply; a glass body formed with a plurality of grooves to receive said respective internal and external connection lines; conductive foils to electrically connect said internal and external connection lines; a glass tube to receive said internal and external connection lines such that said internal and external connection lines extend at one ends thereof out of said glass body, said glass body having an outer surface fusion connected to said glass tube; and a plug member to close one end of said glass tube, said glass body being fusion connected to a large diameter glass tube at the other end thereof.

Since the carbon wire heating element and the wire carbon members are thus accommodated in a compressed state, only insertion of the internal connection lines of the sealing terminal section into said compressed portion facilitates the connection of the carbon wire heating element and the sealing terminal section. Further, since a positive connection is assured, accidents due to sparks or short circuiting is prevented.

It is further preferred that said small diameter glass tube section integrally has a hairpin-shaped or spiral small diameter glass tube sealing said carbon wire heating element therein.

Since said small diameter glass tube is integrally has a hairpin-shaped or spiral small diameter glass tube such that the glass tube sealing the carbon wire heating element is provided in the form of a unitary tube member, the thermal capacity of the heating element sealing portion is lowered, thus obtaining a heater having a quick thermal response.

It is also preferable that said small diameter glass tube section and said small diameter glass tube are enclosed by said large diameter tube, and thus constructed, a heater having a remarkable mechanical strength and reliability is obtained.

It is also preferable that said small diameter glass tube charged with the compressed wire carbon members is provided integrally or separately beneath said solid glass body formed with grooves to receive said carbon wire heating element, said solid glass body receiving said carbon wire heating element at its outer surface thereof and said small diameter glass tube being enclosed by a large diameter glass tube, said solid glass body having an outer surface to be connected to said large diameter glass tube through fusion. Thus fusing the outer surface of the solid glass body to the large diameter glass tube, a heater of higher mechanical strength and reliability is obtained.

In this connection, the small diameter glass tube referred to in the invention stands for that having an inside diameter of at least about 5 to 15 mm (preferably 5 to 15 mm). In said small diameter glass tube, it is not preferable that the inside diameter of the portion where a plurality of wire carbon members are accommodated in a compressed state is less than 5 mm because the resultant coloric values are too large and it is also not preferable that with the diameter more than 15 mm because the heater can become too large.

Further, the thickness of the small diameter glass tube is about 1 to 2 mm (preferably 1 to 2 mm) and the large diameter glass tube referred to in the invention stands for a glass tube having an inside diameter larger than the sum of the outside diameters of at least two small diameter glass tubes; that is, a glass tube having the inside diameter exceeding 14 mm.

It is further preferable that said small or large diameter glass tube is composed of an elongated first flat glass plate formed with grooves to receive said carbon wire heating element therein and a second flat glass body to be fused to said first flat glass body to close said groove.

Thus, it is possible to form an elongated flat plate-like heating element by use of the elongated flat plate-like glass body such that a heater having a high mechanical strength and high reliability is obtained.

In this connection, the glass tube sealing the carbon wire heating element is not limited to an ordinary cylindrical tube but includes an elongated plate-like member with said elongated plate-like glass body fused.

It is also preferable that two separate glass tube constituting the sealing terminal section are provided, each including a glass portion, a graded seal portion and a tungsten glass portion in which the connection lines are sealed at the tungsten glass portion while said glass portion is fused to a small or large diameter glass tube to accommodate the carbon wire heating element. Thus constructed, it is possible to positively prevent a glow discharge between the connection lines.

It is also preferable that said glass body is formed by fusing a plurality of a flat or curved plate-like glass members into an integral member with at least one of said plate-like glass member being formed in one side thereof with grooves to accommodate said carbon wire heating element and the other side than said grooves being fused to the other plate-like glass member into an integral member. Thus integrally fused, a high mechanical strength is obtained.

In this way, the heater of the invention is suitable for directly dipping into a storage tank containing a wet etching agent or a grinding agent.

Particularly, the invention contributes to prevention of metallic contamination from the wet etching agent or the grinding agent and there is no likelihood of damage even if it is directly dipped into the storage tank containing the wet etching agent or the grinding agent to assure a high mechanical strength.

Further, the heater of the invention shows remarkable effects for prevention of metallic contamination in a heat treatments atmosphere in various heat treatment of semiconductors together with a high mechinical strength and long service life.

BRIEF DESCRIPTION OF THE DRAWINGS

FIG. 7a is a general perspective view of the second embodiment of the invention relating to the rod-shaped material;

FIG. 7b is an exploded perspective view of the primary portion of FIG. 7a;

DETAILED DESCRIPTION OF PREFERRED EMBODIMENTS

Hereinafter, the present invention will be explained with reference to the drawings.

Figure 1:
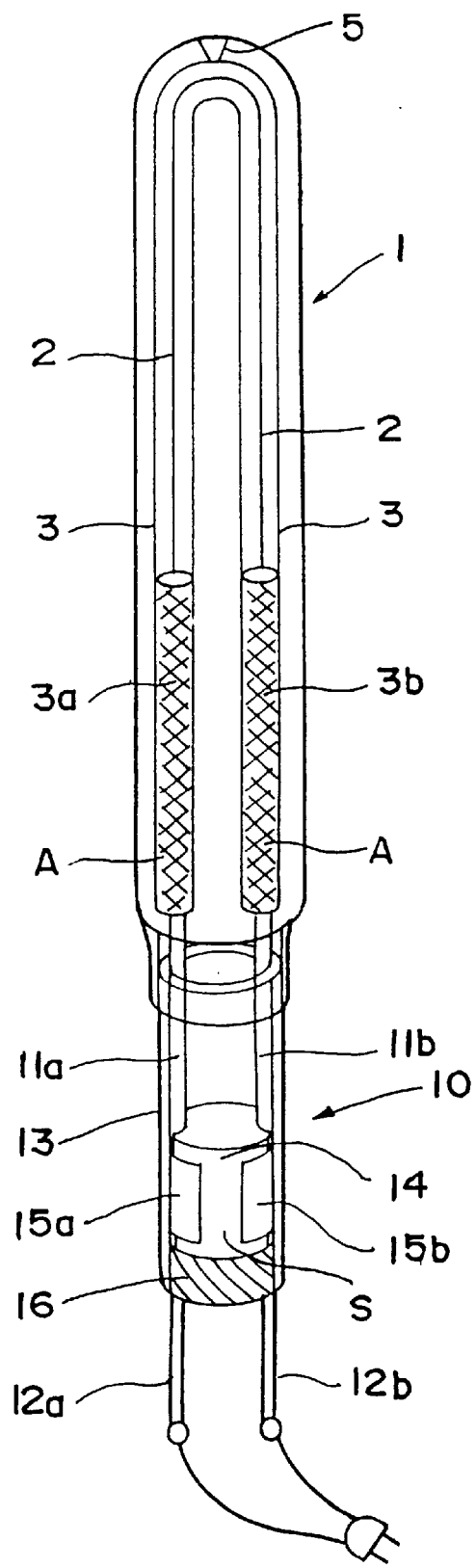
FIG. 1 is a perspective view of the first embodiment of the present invention relating to the rod-shaped heater.

In this connection, FIG. 1 is a perspective view of the first embodiment of the present invention relating to the rod-shaped heater; FIG. 2a and FIG. 2b are views of the internal connection lines and the carbon wire heating element shown in FIG. 1 being connected; FIG. 3 is a view of the carbon wire; and FIG. 4 is a perspective view showing a sealed terminal used therein.

Figure 4:
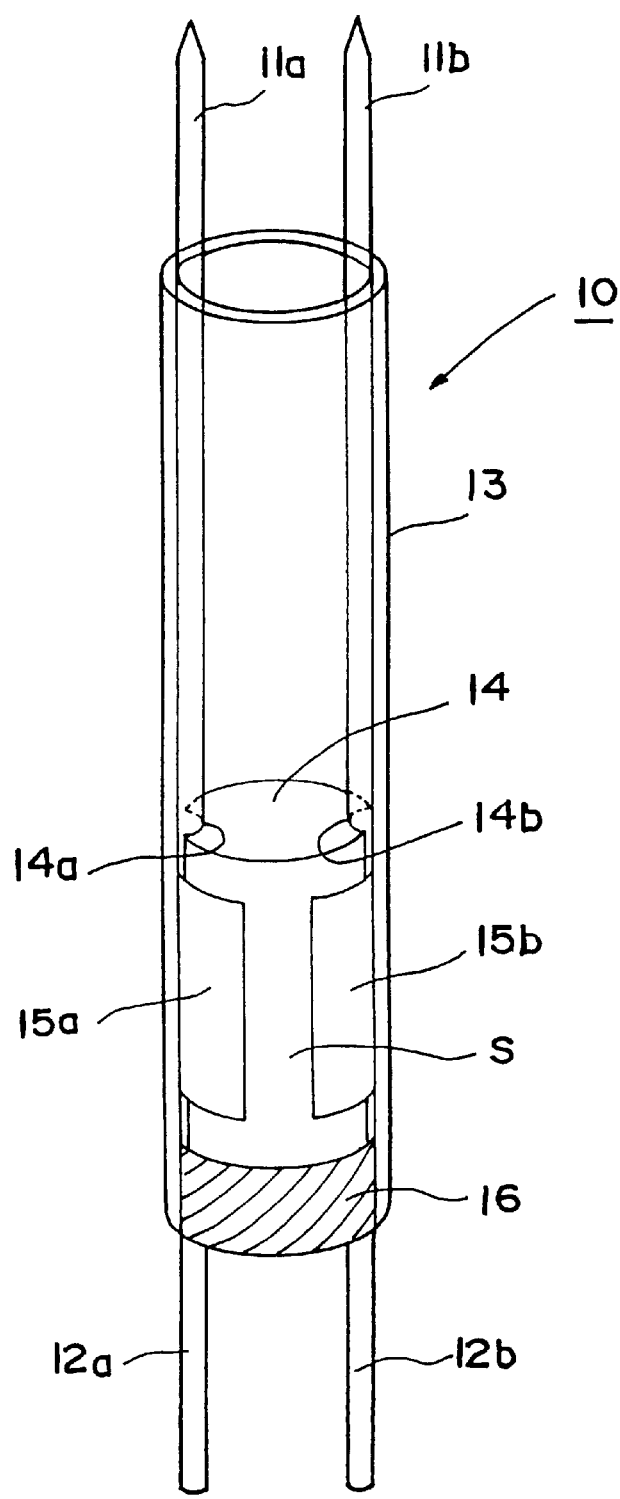
FIG. 4 is a perspective view showing a sealed terminal used in the rod-shaped heater of FIG. 1.

FIG. 5a and FIG. 5b are a view of the internal and external connection lines and the conductive foils used in FIG. 4 being connected; FIG. 6 is a perspective view of a quartz glass body used in the sealed terminal of FIG. 4.

The rod-shaped heater shown in FIG. 1 is composed of a carbon wire heating element 2; a small diameter quartz glass tube 3 having a hair pin configuration and opposite ends thereof open; wire carbon members A charged in said tube 3 at opposite end portions 3a and 3b thereof are in a compressed state; a large diameter quartz glass tube 4 closed at one end and is opened at the other end to accommodate said small diameter quartz glass tube 3 therewithin; and a sealed terminal section 10 attached to said open end of the large diameter quartz glass tube 4, where said terminal section is equipped with internal connection lines 11a and 11b to be connected to the carbon wire heating element 2 and external connection lines 12a and 12b to supply power.

Said small diameter quartz glass tube 3 is secured to the inside of said large diameter quartz glass tube 4 at a top thereof by way of a fixing member 5.

Said fixing member 5 is provided by forming a protuberance at the top of said small diameter quartz glass tube 3, melting said protuberance from outside said large diameter quartz glass tube 4 with said small diameter glass tube 3 being accommodated therewithin and adhering them through the fusion.

Said carbon wire heating element 2 is prepared by binding a plurality of carbon fibers each into fiber bundles and weaving a plurality of such fiber bundles into a wire-shaped cord as shown in FIG. 3.

Said carbon wire hating element 2 is inserted into said small diameter quartz glass tube 3 to extend as far as said opposite open end portions 3a and 3b, or to the proximity thereof as shown in FIG. 2a.

Further, said opposite open end portions 3a and 3b of said small diameter quartz glass tube 3 are each charged with compressed wire carbon members A shown in FIG. 3.

Therefore, said carbon wire heating element 2 is buried in said compressed wire carbon members which are also in a compressed state as shown in FIGS. 2a and 2b.

Said wire carbon wire members A and said carbon wire heating element 2 are accommodated to extend therein substantially in parallel to the axis of said opposite open end portions 3a and 3b of the small diameter quartz glass tube 3 in a compressed state.

In FIG. 1, the hairpin-curved small diameter quartz glass tube 3 is shown but said tube 3 may not be limited to this configuration but may also be shaped like the letter W or in a spiral as necessary.

Further, although FIG. 1 shows the small diameter quartz glass tube 3 with said opposite end portions 3a and 3b already in an integral form, said opposite end portions 3a and 3b may be separated to be adhered through fusion to the ends of said hairpin-curved small diameter quartz tube afterwards.

As a concrete example of said carbon wire heating element 2, a carbon wire is first prepared by binding 300 to 350 carbon fibers each having a diameter of 5 through 15 $\mu$m, for example 7 $\mu$m, into a bundle. Then, a plurality of about 9 such bundles are woven into a carbon wire in the form of a knitted cord, a braid having a diameter of 2 mm to be used as a carbon wire.

In said carbon wire, the weaving span of the carbon wire is 2 to 5 mm or thereabout while the surface fluffing of the carbon wire is 0.5 to 2.5 high mm or thereabout.

In this connection, said "fluffing" is a part of broken carbon fibers projecting from the outer surface of the carbon wire as shown by the numeral a in FIG. 3.

Said carbon wire heating element 2 is preferably constructed such that said fluffing a alone is in contact with the inner wall of said small diameter quartz glass tube 3 while the body of said carbon wire heating element 2 is not.

Thus, the reaction of said quartz glass ($SiO_2$) and the carbon content (C) of the carbon wire heating element 2 is minimized at a high temperature such that degradation of the quartz glass and lowering in durability of the carbon wire is restrained.

In order to realize such a construction, the inside diameter of said small diameter quartz glass tube may be selected in accordance with the diameter and the number of the carbon fibers in said carbon wire heating element.

In view of the heating uniformity, durability stability and dust generation, said carbon fibers are preferably of high purity. Particularly, if the heater 1 is for the heat treatments of wafers in the semiconductor manufacturing process, the ash contents in said carbon fibers is preferred to be less than 10 ppm (Japanese Industrial Standards JIS R 72223-1979). Further less than 3 ppm ash contents is even more preferable.

Now, a concrete example of wire carbon members A will be explained. Wire carbon members A are prepared by binding 300 to 350 carbon fibers, each having a diameter of 5 to 15 $\mu$m, for example, 7 $\mu$m into a bundle, in the similar way as in said carbon wire. About 9 such bundles are woven into a wire carbon in the form of a knitted cord or a braid.

In said wire carbon, the weaving span is 2 to 5 mm while the surface fluffing of the carbon fibers is 0.5 to 2.5 mm or thereabout.

In this connection, said "fluffing" is a part of broken carbon wires projecting from the outer surface thereof as shown by the numeral a in FIG. 3.

The wire carbon members A are preferably made from the same, or at least a similar material as that of the carbon wire heating element 2, considering that they are in a shape of knitted cord or braid. In this connection, the "same" preferably means being of the same carbon fiber diameter, the same number of bound carbon fibers, the same number of fiber bundles, the same knitting method, the same weaving span, the same fluffing and the same material.

And if the carbon wires are used for heat treatments of wafers in the semiconductor manufacturing process like in the case of the carbon wire heating element 2, it is preferable that the ash contents in the carbon fibers of the wire carbon members A is less than 10 ppm. The ash contents in the carbon fibers is more preferably less than 3 ppm.

Then, the number of the wire carbon members accommodated in opposite end portions 3a and 3b of the small diameter quartz glass tube 3 is preferably equal to or more than that of the carbon wire heating element 2. It is even more preferable if there are five or more wire carbon members A for every carbon wire heating element 2.

Specifically, in order to make the number of carbon members A more than five times that of carbon wire heating element, provide, for example, fourteen wire carbon members A for one carbon wire heating element 2, or twelve wire carbon members A for two carbon wire heating elements 2.

The carbon wire heating elements 2 and the wire carbon members A is composed of 300 to 350 carbon fibers each having a diameter of 7 $\mu$m bound into one fiber bundle and nine such fiber bundles are woven into a knitted cord or a braid having a diameter of 2 mm, which has an electric resistance of 10 $\Omega$/1 m/piece at a room temperature, and or 5 $\Omega$/1 m/piece at a temperature of 1,000° C.

Further, the electric resistance of five such carbon wires when bound is 2 $\Omega$/1 m/piece at a room temperature and 1 $\Omega$/1 m/piece at 1,000° C.

Therefore, if five (5) such carbon wire members A are compressed within the small quartz glass tubes 3a and 3b, the electric resistance is about 2 $\Omega$/1 m/piece at room temperature and 1 $\Omega$/1 m/piece at 1,000° C., meaning that the electrical resistance is lowered down to one fifth (⅕) thereof: that is, 1/(the number of pieces).

As a result, the heat produced by the wire carbon members A is drastically reduced as compared with the heat produced by the carbon wire heating element 2.

The wire carbon members A interposed between the carbon wire heating element 2 and internal connection lines 11a and 11b minimizes the heat which can be transferred from the carbon wire heating element 2 to the internal connection lines 11a and 11b so that degrading due to high temperature of the sealed terminal 10 is prevented.

Like in the case of the carbon wire heating element 2, the reaction of quartz glass ($SiO_2$) with the carbon (C) of the wire carbon members A at a high temperature is minimized so that the degrading of the quartz glass, and the reduction in the durability of the carbon wire is prevented.

Next, the connection between the sealed terminal 10 and the internal connection lines of said sealed terminal 10 and the carbon wire heating element 2 will be explained with reference to FIG. 4 through FIG. 6

As mentioned in the foregoing, said wire carbon members A are compressed within the open end portions 3a and 3b of the small diameter quartz glass 3.

Figure 2:
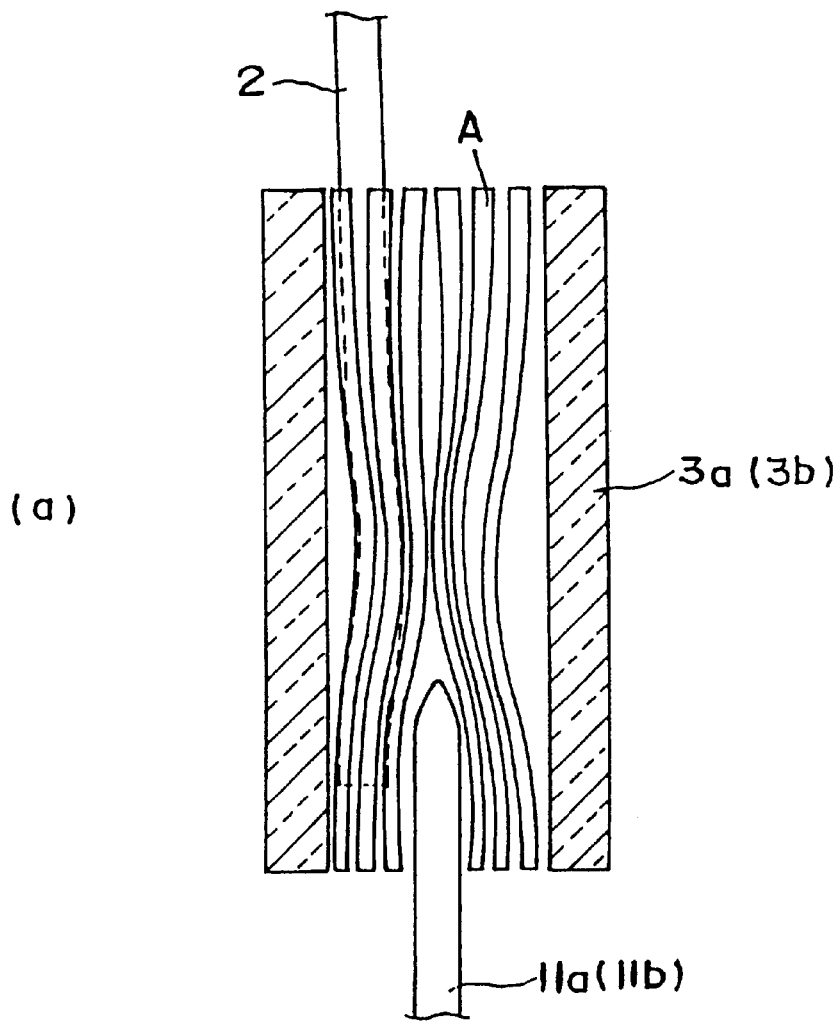
FIG. 2a is a longitudinal cross section of the connection lines and the carbon wire heating element shown in FIG. 1 being connected.
FIG. 2b is a lateral cross section thereof.
Figure 2:
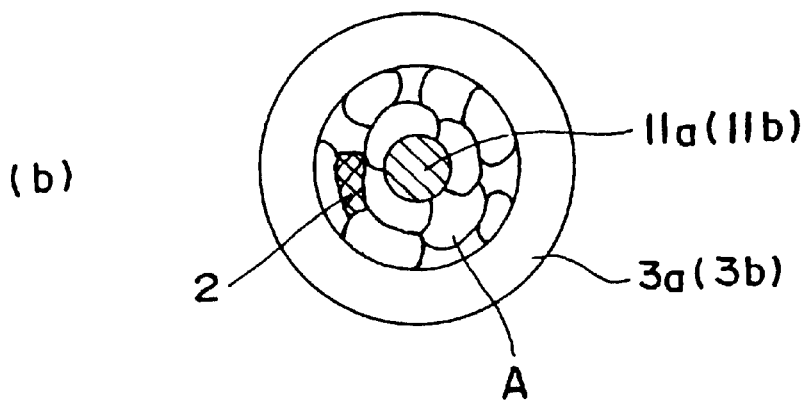
Figure 3:
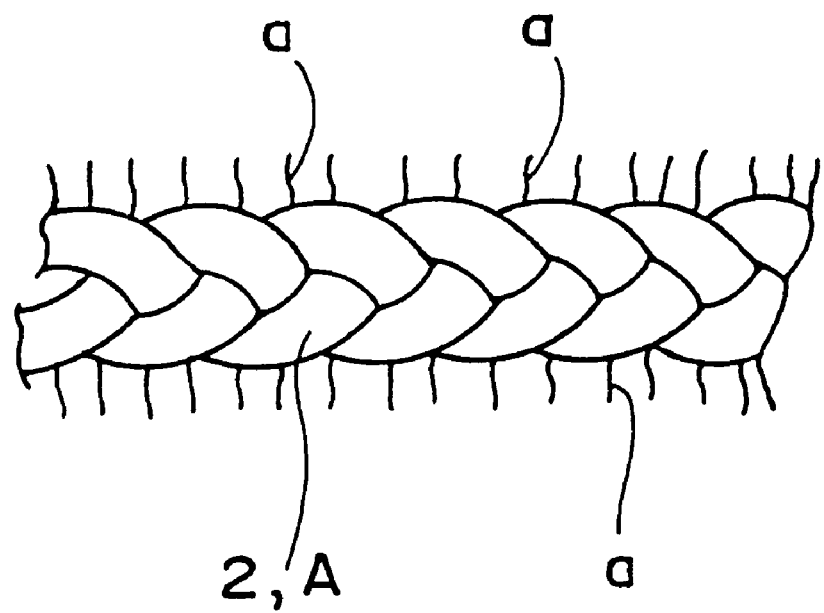
FIG. 3 is a plan view of the carbon wire heating element and its wire carbon material used in the rod-shaped heater of FIG. 1.

Then, FIG. 1 and FIG. 2 show that the carbon wire heating element 2 is received in said wire carbon members A while the internal connection lines 11a and 11b are received in the sealed terminal 10, which will be explained later.

Said sealing terminal section 10 is composed of internal connection lines 11a and 11b to be connected to the compressed portion of the carbon wires received in the open end portions 3a and 3b of the small diameter quartz glass tube 3; external connection lines 12a and 12b are to be connected to a power source not shown; a quartz glass tube 13 having a diameter to be received in said large diameter quartz glass tube 4; a quartz glass body 14 to closely fit in the inner wall of said quartz glass tube 13; grooves 14a formed in the outer surface of said quartz glass body 14 to retain said internal and external lines; molybdenum (Mo) foils 15a and 15b to be electrically connected to the internal and external connection lines retained in said outer surface of the quartz glass body 14; and a plug member 16 to close the end of the quartz glass tube 13.

Now, although FIG. 1 shows the quartz glass tube 13 having a diameter suited to be inserted into said large diameter quartz glass tube 4, there is no limitation in this regard and said quartz glass tube 13 may have a diameter large enough to accept the quartz glass tube 4 thereinto. Said quartz glass tube 13 may have an equal diameter to that of the large diameter quartz glass tube 4 provided that the quartz glass tube 13 and the large diameter quartz glass tube 4 can be integrated by fusing or welding means.

Said internal connection lines 11a and 11b and external connections lines 12a and 12b are made of molybdenum (Mo) or tungsten (W) rods having a diameter of 1 to 3 mm.

The diameters of said internal connection lines 11a and 11b, and external connection lines 12a and 12b may be chosen as necessary though too small a diameter can lead to a larger electric resistance, which is not desirable.

On the other hand, too large a diameter is not desirable because the size of the terminal becomes larger.

In order to assure the easy connection of the internal connection lines 11a and 11b to the carbon wires, that is, the carbon members A compressed within the small diameter quartz glass tube 3, the end of said internal connection lines 11a and 11b are pointed.

The end portions of said internal connection lines 11a and 11b and said external connection lines 12a and 12b are accommodated in the grooves 14a formed in the outer surface of said quartz glass body 14 such that the outer surfaces of the accommodated internal connection lines 11a and 11b and said external connection lines 12a and 12b will not protrude excessively from the outer surface of the quartz glass body 14.

Further, the internal connection lines 11a and 11b and the external connection lines 12a and 12b are electrically insulated by said quartz glass body 14 when accommodated in said grooves 14a while being electrically connected by said molybdenum (Mo) foils 15a and 15b.

Figure 5:
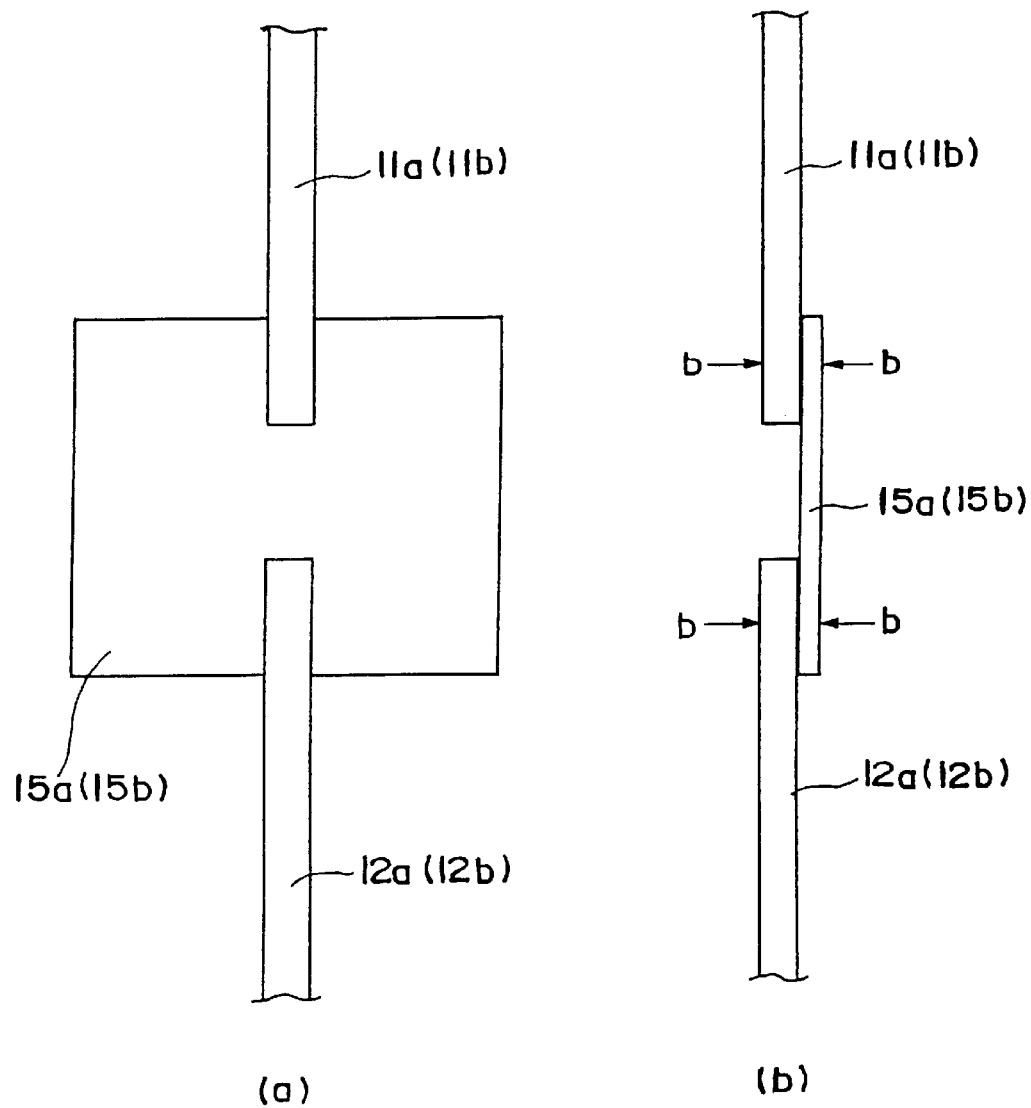
FIG. 5a is a plane view of the connection lines and the conductive foils used in the rod-shaped heater of FIG. 4 being connected.
FIG. 5b is a side view of the same.
Figure 6:
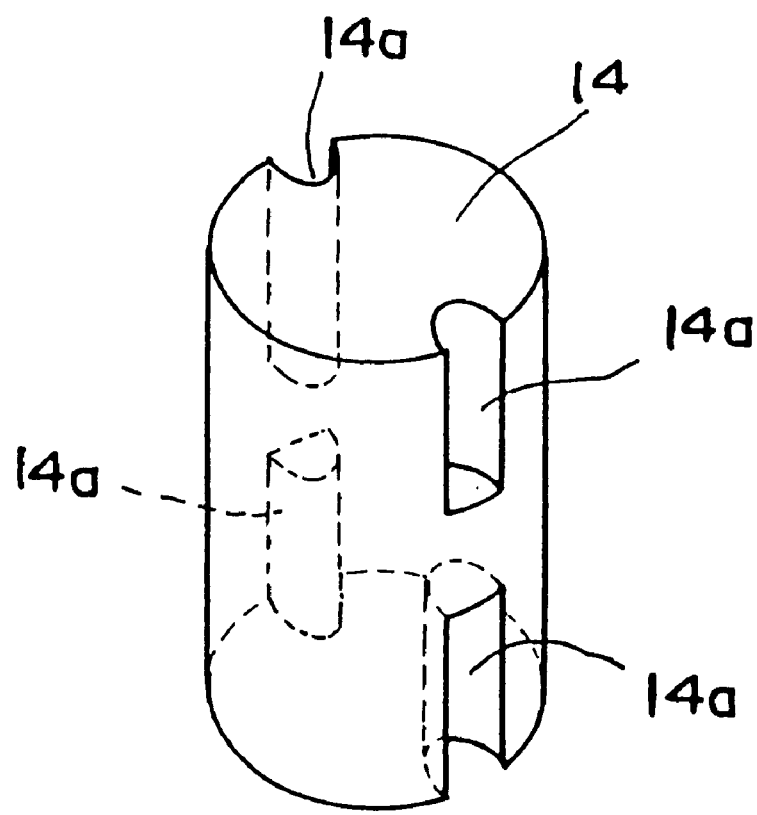
FIG. 6 is a perspective view of a quartz glass body used in the sealed terminal of FIG. 4.

Said internal connection lines 11a and 11b, and the external connection lines 12a and 12b are electrically connected by the molybdenum (Mo) foils 15a and 15b at a surface thereof with a predetermined spacings as shown in FIG. 5 by spot welding and fixed at upper and lower portions thereof.

Said spot welding is done from the direction b in FIG. 5.

Said molybdenum foils 15a and 15b to which said internal connection lines 11a and said external connection lines 12a are fixed to the outer surface of the quartz glass body 14 to extend along the outer surface thereof.

Further, in order to avoid a short circuiting of said molybdenum foils 15a and 15b, a predetermined spacing S is provided therebetween.

Further, there is a plug member 16 made cement, containing pulverzied alumina ($Al_2O_3$) as a main ingredient, to prevent oxidation of said molybdenum (Mo) foils 15a and 15b and said external connection lines 12a and 12b.

The cement is prepared by, for example, adding water to the pulverized alumina and drying the admixture at the temperature of 200° C. to set.

At a temperature of 350° C. or more, said molybdenum (Mo) foils 15a and 15b react with oxygen or moisture and expand in volumn at the time of oxidation.

Said plug member 16 blocks outside atmosphere such that the expansion of said molybdenum foils 15a and 15b is avoided to prevent the quarts glass tube from breaking.

As a plug member, resin or a cement using pulverized $SiO2$ may be used instead of said cement ($Al_2O_3$) member but it is preferable to use a cement member using alumina ($Al_2O_3$) as a main ingredient in view of heat resistance and preventing the formation of dry cracks.

In this connection, the sequence for manufacture of the rod-shaped heater in the first embodiment is, in principle, as follows.

(1) Manufacture of the carbon wire heating member 2 and arrangement thereof within the small diameter quartz glass tube 3 (including the connection of said plurality of wire carbon members A and the carbon wire heating element 2 at opposite end portions of said small diameter quartz glass tube 3)

(2) Manufacture of the sealed terminal section 10 which connects the internal connection lines 11a and 11b and the external connection lines 12a and 12b;

(3) Insert connection of said internal connection lines 11a and 11b of the sealed terminal section 10 into a plurality of wire carbon members A accommodated in the opposite end portions of said small diameter quartz glass tubes 3.

(4) Fusion connection of the outside of the bent portion of said hairpin-shaped small diameter glass tube 3 to the closed end of said large diameter quartz glass tube 4.

(5) Fusion connection of the internal connection line side end portion of said sealed terminal section 10 to the open end of said large diameter quartz glass tube 4 having one end thereof closed to cover the small diameter quartz glass tube 3 in general (in this case, a branch pipe, which is not shown, may be fusion connected in advance on the wall of the large diameter quartz glass tube 4 to supply nitrogen gas therein while fusion connection is conducted with an acid hydrogen burner).

(6) Finally, the inside pressure of said large diameter quartz tube 4 and sealed terminal section 10 is reduced down to less than 2 Torr and preferably down to below 1 Torr before said connection side ends of said branch pipes is heated by the acid hydrogen burner until it is closed and, then, said branch pipes are removed.

In the above described first embodiment, the open end portions 3a and 3b of said small diameter quartz glass tube 3 are charged with compressed wire carbon members A with said carbon wire heating element 2 in turn being charged in said wire carbon members A together with said internal diameter lines 11a and 11b.

In this connection, the open end of the small diameter quartz glass tube may be of a reasonably larger size than the small diameter quartz glass in case the number of the wire carbon members A to be accommodated is intended to be increased.

Since the carbon wire composing the carbon members A is prepared by binding fine carbon fibers into carbon bundles and weaving a plurality of such carbon bundles into a knitted cord or a braid, said knitted cord or said braid contains a very small quantity of moisture therein.

Said internal connection lines 11a and 11b formed of molybdenum (Mo) or tungsten (W) rods are slightly oxidized at a surface thereof.

Further, at the time of fusing said large diameter quartz glass tube 4 and said quartz glass tube 13 shown in FIG. 1 into an integral body, oxygen from the acid hydrogen burner, although small in quantity, is introduced into said quartz glass tubes 4 and 13.

However, the carbon content of carbon wires in the above specific structure provides a reducing reaction which functions to restrain the oxidization of the internal connection lines 11a and 11b from accelerating such that sparks are prevented from being generated.

If an attempt is made to connect the heating element and the internal connection lines by way of a material made of carbon member in general use, a good connection may not be maintained at a high temperature due to the difference in the thermal expansion coefficients.

However, the first embodiment assures a good electrical connection because the carbon wire heating element 2 and internal connection lines 11a and 11b are attached to the portion where a plurality of carbon wires are arranged in a compressed state in parallel to the axis of the end portions 3a and 3b of the quartz glass tube such that heat from said carbon wire heating element 2 will not make the connection become loose.

Further, the use of the carbon wire heating element 2 makes it possible to prevent metallic contamination of wet etching agent, grinding agent or the like by way of said heating element 2 and said quartz glass tube.

Next, the second embodiment will be explained with reference to FIG. 7.

Figure 7:
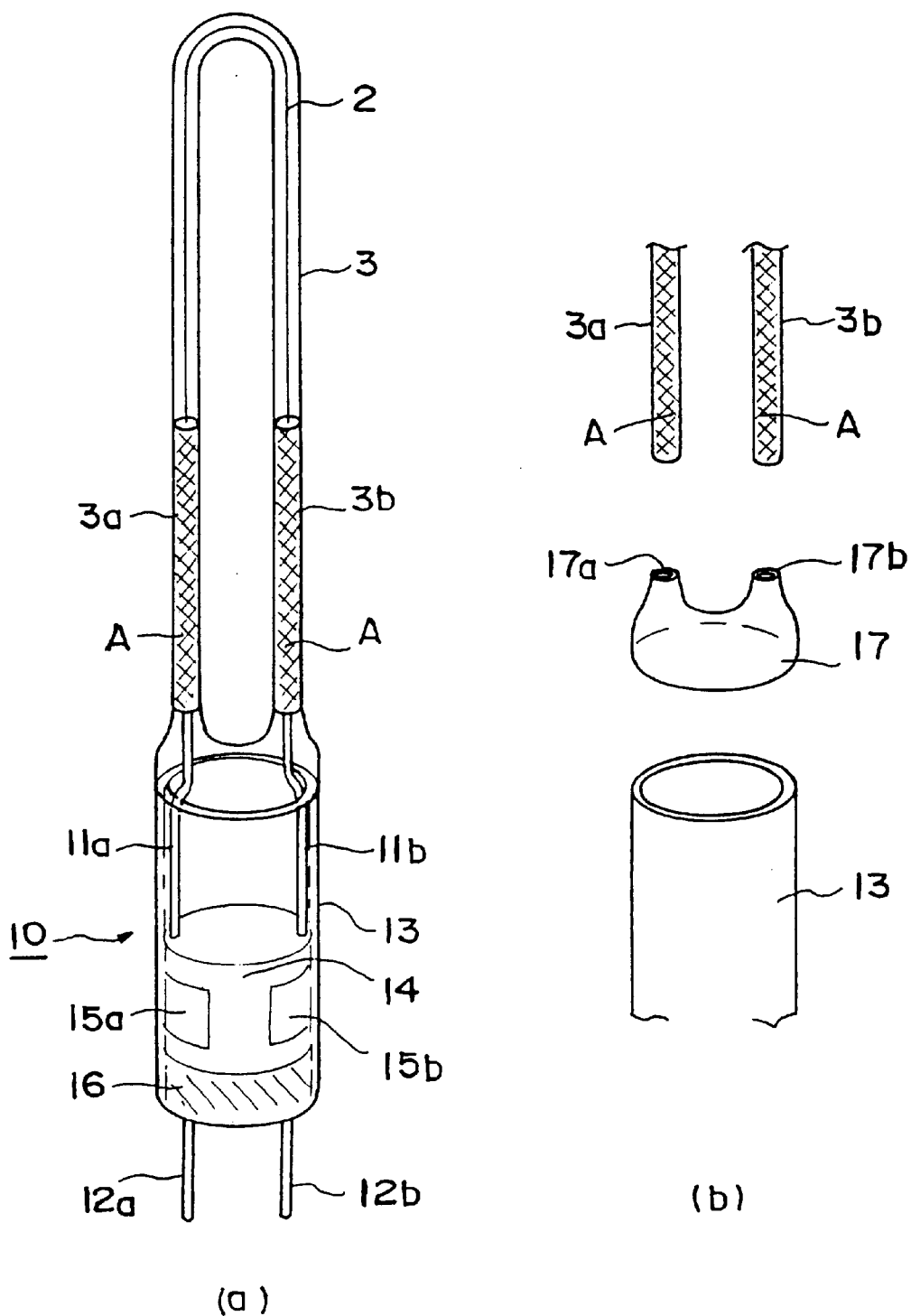

FIG. 7 is a perspective view of the rod-shaped heater with the same numerals used to denote the similar members used in the first embodiment shown in FIG. 1 through FIG. 6 and explanations will be omitted for similar members already explained in the first embodiment.

The feature of this embodiment is that the large diameter quartz glass tube 4, used in the first embodiment as shown in FIG. 1, is omitted.

In other words, the quartz glass tube 14 of the sealed terminal section 10 is attached to the bifurcated cap 17 of quartz glass, while the attaching portion 17a and 17b of said bifurcated cap 17 is in turn attached to the ends 3a and 3b of said small diameter quartz glass tube 3.

The rod-shaped heater 1 disclosed in the form of the second embodiment is integrated by fusion connecting said quartz glass tube 14, said bifurcated cap 17, said attaching portion 17a and 17b, and the ends 3a and 3b of the small diameter quartz glass tube 3.

Since the large diameter quartz glass body 4 is omitted, a heater of high thermal response is realized by making the heat capacity of the sealing portion of the heating element smaller than the first embodiment shown in FIG. 1.

In this connection, the small diameter quartz glass tube 3 is not limited to the hairpin configuration as shown in FIG. 7a but the upper portion alone of said one end 3b of the small quartz glass tube 3 may be made into a spiral form or any other special forms.

The sequence of the manufacture of the rod-shaped heater in the second embodiment is, in principle, as follows.

(1) Manufacture of the carbon wire heating element 2 and arrangement thereof within the small diameter quartz glass tube 3 (including the connection of said plurality of wire carbon memebers A and the carbon wire heating element 2 at opposite portions of said small diameter quartz glass 3)

(2) The attaching portions 17a and 17b of said bifurcated cap 17 are fusion adhered to the ends 3a and 3b of said small diameter quartz glass 3 (in this case, the opposite side of said attaching portions 17a and 17b of said bifurcated cap 17 is made in a longer form than shown in the figure with said opposite side closed, and a branch pipe not shown may be connected near the flank of said attaching portions 17a and 17b of the bifurcated cap 17 to inject nitrogen gas therethrough, while fusion connection is conducted y an acid hydrogen burner.

Thereafter, said opposite side of the attaching portions 17a and 17b are cut such that the final shape of said bifurcated cap 17 are attained).

(3) Manufacture of the sealed terminal 10 with the internal connection lines 11a and 11b and the external connection lines 12a and 12b.

(4) Insert connection of said internal connection lines 11a and 11b of the sealed terminal 10 into a plurality of wire carbon members A charged in the opposite end portions of said small diameter quartz glass tube 3.

(5) Fusion connection of the sealed terminal section 10 on an internal connection line side, the attaching portions 17a and 17b of said bifurcated cap, and the opposite end thereof (in this case, the fusion connection is done while nitrogen gas is being injected in as in the case (2))

(6) Finally, the inside pressure of said small diameter quartz glass tube 3 and the sealed terminal 10 is reduced down to less than 2 Torr and preferably less than 1 Torr before said connection side ends of the branch pipes is heated by the acid hydrogen burner until it is closed and, then, said branch pipes are removed.

Next, the third embodiment will be explained with reference to FIG. 8 and FIG. 9.

Figure 8:
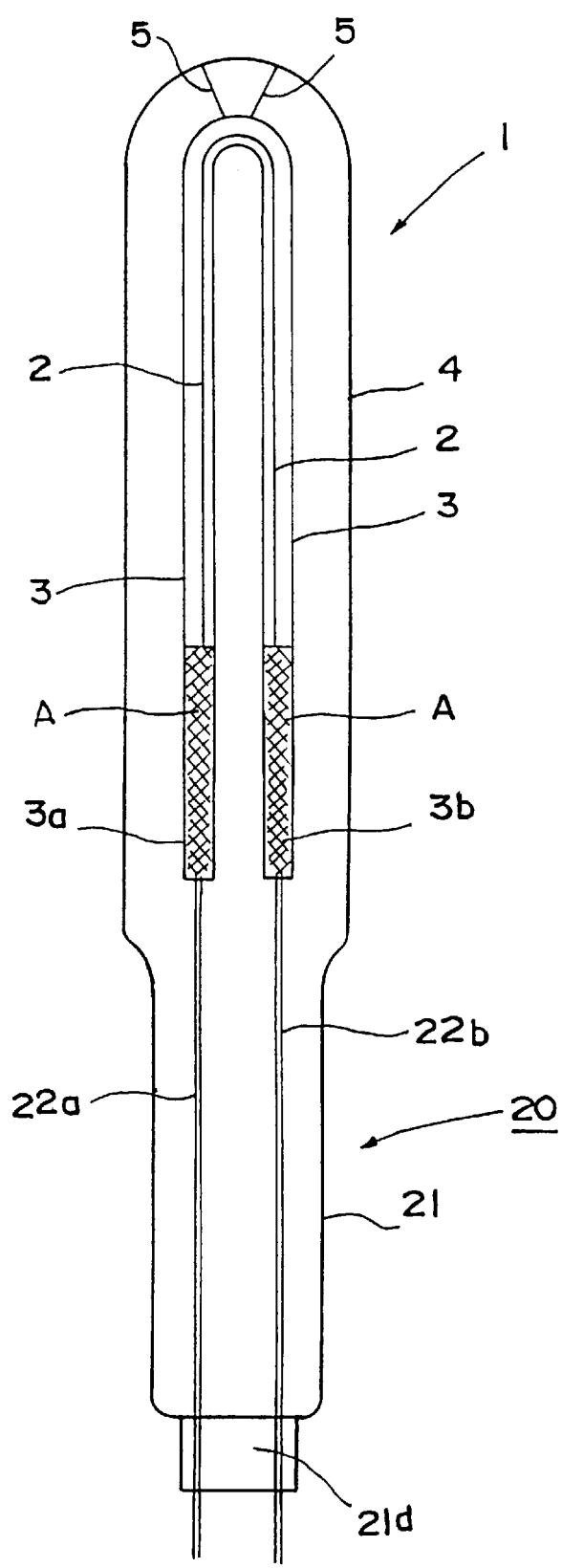
FIG. 8 is a partial side view of the third embodiment of the present invention relating the rod-shaped heater.
Figure 9:
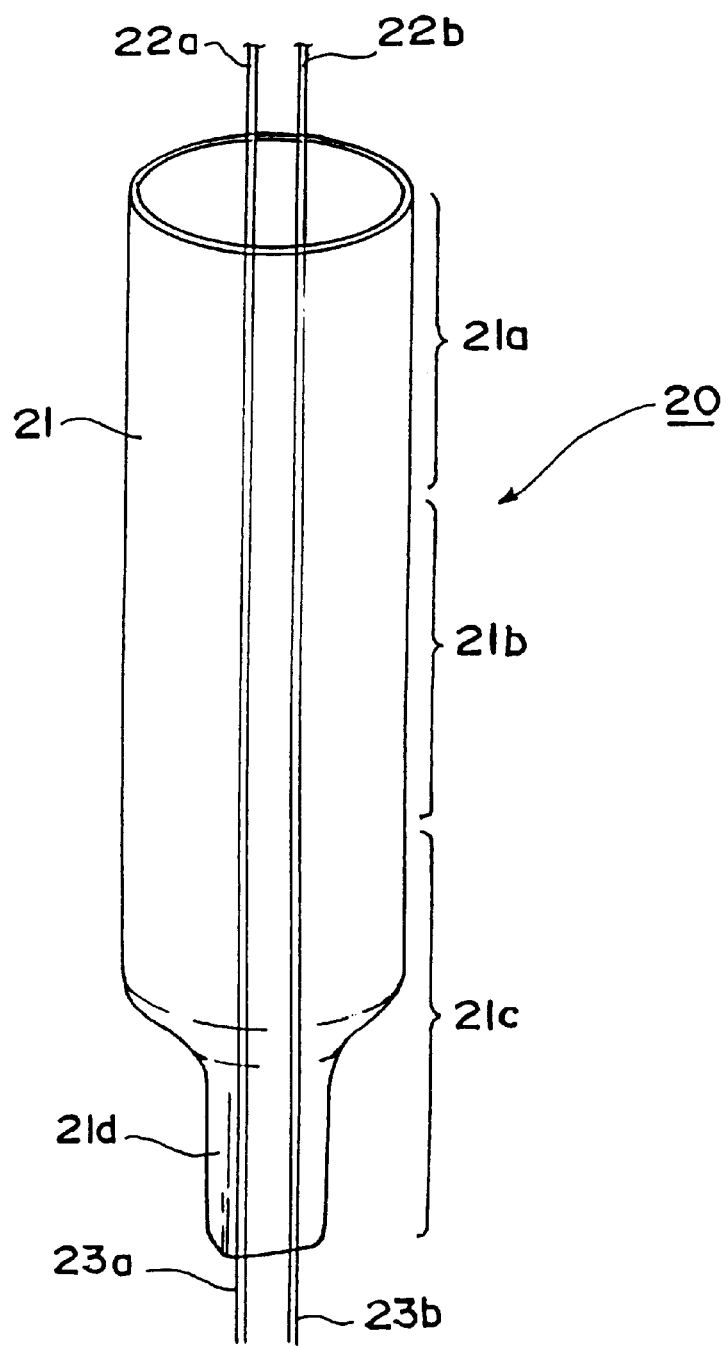
FIG. 9 is a perspective view of the sealed terminal used in the rod-shaped heater of FIG. 8.

In this connection, FIG. 8 is a side view of the rod-shaped heater and FIG. 9 is a perspective view of the sealed terminal used in FIG. 8.

Further the members similar to those shown in FIG. 1 through FIG. 7 are accorded with similar numerals and explanation thereof will be omitted.

This embodiment is a more simplified form of the sealed terminal.

Specifically, the glass tube 21 constituting a sealed terminal section 20, that is, the glass tube 21 integrated by being fused to a large diameter quartz glass tube 4 is composed of members formed of materials including, from the large diameter glass tube side 4, a quartz glass portion 21a, a graded seal portion 21b, and tungsten (W) glass portion 21c.

Then, tungsten (W) connection lines 22a and 22b to be connected to the carbon wire compressed within the small diameter quartz glass tube 3 are pinch sealed at said tungsten (W) glass portion 21c.

In other words, this structure has a feature that the pinch sealed portion 21d is formed of tungsten (W) glass having a thermal expansion coefficient close to tungsten (W) composing the connection lines while the fusion side of the large diameter quartz glass tube 4 are formed of quartz glass.

In this way, since the pinch sealed portion 21d is formed of tungsten (W) glass having a thermal expansion coefficient close to tungsten (W) constituting the connection lines, the breakage of glass portion (the pinch sealed portion 21d) due to the thermal expansion of the connection lines 22a and 22b at a high temperature is prevented.

Then, when the rod-shaped heater is used as a the semiconductor manufacturing heater, the large diameter quartz glass tube 4, which is made of high purity quartz glass, is used.

Therefore, if the quartz glass tube 21 (the quartz glass section 21a) fused to the large diameter quartz glass tube 4 is formed of the material similar or identical to the large diameter quartz glass tube 4, its breakage as a result of the thermal expansion is prevented.

Also, the use of high purity quartz glass makes it possible to prevent metallic contamination.

Further, there is a feature that a graded seal portion 21b is formed between quartz glass portion 21a and the tungsten (W) glass portion.

The ingredient of the seal portion 21b gradually varies in the longitudinal direction, starting from tungsten glass portion 21c up to quartz glass portion 21a. In the proximity of quartz glass portion 21a, the coefficient of thermal expansion of the ingredient of the ingredients approximates that of the quartz glass, while in the proximity of tungsten glass portion 21c, the coefficient of thermal expansion approximates that of the tungsten glass. In this way, the breakage of glass tube 21 due to thermal expansion at high temperature can be prevented.

In this way, as compared with the first embodiment, the structure of the sealed terminal is simplified such that the number of parts involved is reduced together with the man hour.

Further, since the integrated structure of said glass tube 21 and the large diameter quartz glass tube 4 by fusion or melt connection is composed of the quartz glass portion 21a, the graded seal portion 21b, and the tungsten (W) glass 21c, a breakage at a high temperature is minimized.

Now then, the sequence of the manufacturing procedure of the rod-shaped heater in the third embodiment is, in principle, as follows.

(1) Manufacture of the carbon wire heating element 2 and arrangement of thereof within the small diameter quartz glass tube 3 (including the connection of a plurality of wire carbon members A and the carbon wire heating element 2 at opposite portions of said small diameter quartz glass 3).

(2) Manufacture of the sealed terminal by securing said tungsten (W) connection lines 22a and 22b at the punch sealed portion.

(3) Insert connection of said tungsten (W) connection lines 22a and 22b of the sealed terminal section 10 into the plurality of wire carbon members A charged in the opposite end portions 3a and 3b of said small diameter quartz glass tube 3.

(4) Fusion connection of the outside of the bent portion of the hairpin-shaped small diameter quartz glass tube 3 to the inside of the closed end of the large diameter quartz glass tube 4.

(5) Fusion connection of the open end of the large diameter quartz glass tube 4 and the open end of the sealed terminal section 20 (in this case, a branch pipe, which is not shown, may be fusion connected in advance on the wall of the large diameter quartz glass tube 4 to supply nitrogen gas therein, while fusion connection is conducted with an acid hydrogen burner).

(6) Finally, the inside pressure of said large diameter quartz glass tube 4 and the sealed terminal 20 is reduced down to below 2 Torr and preferably below 1 Torr before the connection side end of said branch pipes is heated by the acid hydrogen burner until it is closed and then, said branch pipes are removed.

Next, the fourth embodiment will be explained with reference to FIGS. 10 through 12.

Figure 10:
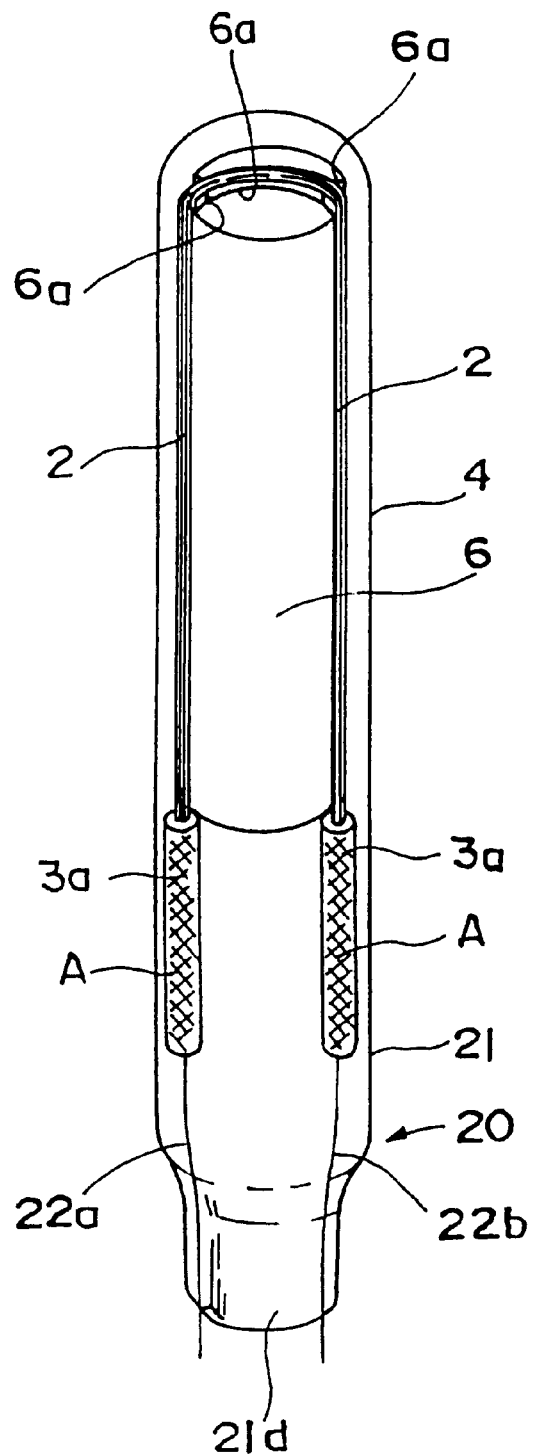
FIG. 10 is a perspective view of the fourth embodiment of the present invention relating to the rod-shaped heater.
Figure 11:
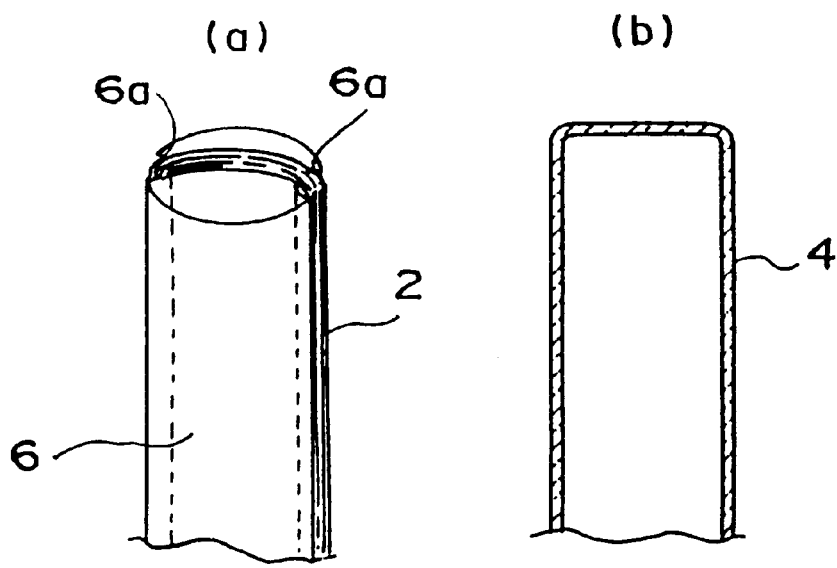
FIG. 11a is a perspective view of the quartz glass body shown in FIG. 10.
FIG. 11b is a cross section of the quartz glass tube.

In this connection, FIG. 10 is a side view in part of the rod-shaped heater and FIG. 11 is an outline view showing a quartz glass body and a quartz glass tube used in FIG. 10.

Figure 12:
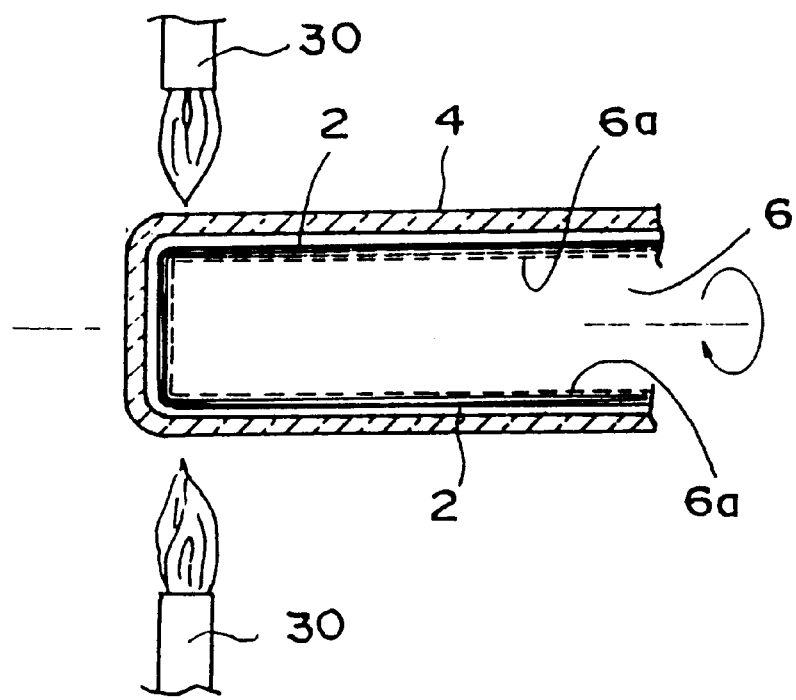
FIG. 12 is an explanatory view of the quartz glass body and the quartz glass tube being adhered to each other through fusion.

FIG. 12 is a an outline of the manufacturing method.

In the figures, the members identical to or corresponding to the members shown in FIGS. 1 through 9 are accorded the identical numerals, explanation of which will be omitted.

The feature of this embodiment is that the carbon wire heating element 2 is accommodated in the groove formed in the outer surface of the solid quartz glass body 6.

More specifically, in the rod-shaped heater 1 in this embodiment, a quartz glass body 6 formed in the outer surface thereof with the groove 6a to accommodate the carbon wire heating element 2 is provided integrally or separately above the small diameter quartz glass tube 3a and 3b charged with compressed wire carbon members A. Said quartz glass body 6 attached with the carbon wire heating element 2 at an outer surface thereof is accommodated within the quartz glass tube 4 closed at one end and opened at the other end such that said quartz glass body 6 is enclosed by the quartz glass tube 4.

In this connection, for the sealing terminal section 20 of the third embodiment is shown in the figure, a sealing element section 10 shown in the first embodiment may also be used.

Said quartz body 6 is a solid cylinder, around the outer surface of which two straight grooves 6a at angular spacing of 180° are formed in an axial direction.

Said grooves 6a extend to the apex of said quartz glass body 6, said carbon wire heating element 2 being accommodated to extend in one of said grooves 6a to the other through the groove 6a at the apex thereof.

Although straight grooves are disclosed, a shape is not limited thereto but may be formed in the surface around the quartz glass body 6 in a spiral form.

In such a case, it is possible to produce more heat than in the case of straight grooves.

Although the quartz glass tube 4 used in the first and third embodiments are applicable, a type of tube with no cavity in the radial direction upon inserting said quartz glass body 6 thereinto, is preferred.

Thus, if there is hardly such cavity formed between the quartz glass tube 4 and the quartz glass body 6, the mechanical strength of the rod-shaped heater will increase.

Particularly, even more mechanical strength is obtained upon fusion of the outer surface of said quartz glass body 6 and said quartz glass tube 4.

The fusing method will be explained with reference to FIG. 12.

First, the carbon wire heating element 2 is accommodated within the grooves 6 in the outer surface of the quartz glass body 6 and the small quartz glass tubes 3a and 3b are secured to the opposite ends of the carbon wire heating element 2 by means of a plurality of wire carbon members A before said quartz glass body 6 is inserted from the open end of the quartz glass tube 4. After said insertion, said quartz glass tube 4 is heated at the outside surface thereof from the forward end thereof to the rearward end (the sealed terminal side) thereof by heating up to more than 1,300° C. using the acid hydrogen burner 30 such that gradual fusion softening is done.

At this time, said quartz glass tube 4 and said quartz glass body 6 are revolved in relation to said acid hydrogen burner 30 with the inside pressure of the quartz glass tube 4 being reduced down to below 100 Torr such that said quartz glass tube 4 contracts in a radial direction until said quartz glass tube 4 is fused to adhere to said quartz glass body 6.

Thus, since the quartz glass body 6 and the quartz glass tube 4 are fused into an integral member, the mechanical strength increases to prevent any damage thereto.

The sequence of manufacture of the rod-shaped heater according to the fourth embodiment is as follows.

(1) The carbon wire heating element 2 is accommodated within the grooves 6a in the outer surface of the quartz glass body 6 and said small quartz glass tube 3a and 3b is secured to the opposite ends of said carbon wire heating element 2 by means of said plurality of wire carbon member A before said quartz glass body 6 is inserted into the quartz glass tube 4 from the open ends thereof.

(2) At the open end of said quartz glass tube 4, a quartz glass tube (not shown) having one end closed and having a shape similar to the quartz glass tube 4 is provisionally fused (in this case, a branch pipe, which is not shown, may also fusion connected in advance on the wall of the large diameter quartz glass tube 4 to supply nitrogen gas therein while fusion connection is conducted with an acid hydrogen burner).

(3) The inside pressure of said quartz glass tube 4 is reduced from said branch pipes down to less than 100 Torr while fusion softening is done by heating up to more than 1300° C. with the burner 30 from the forward end of the outer surface of the glass tube 4 to the rear end (the sealed terminal side).

(4) Said provisionally fusion connected quartz glass tube closed at one end is cut off and removed.

(5) The open end of the sealed terminal 20 punch sealed with the tungsten connection lines 22a and 22b manufactured in advance, as in the third embodiment described in the foregoing, is fusion connected to the open end of said quartz glass tube. (In this case, fusion connection is conducted by said acid hydrogen burner with the nitrogen ($N_2$) gas being supplied from said branch pipes).

(6) Finally, after the inside pressure of the large diameter quartz glass tube 4 and the sealed terminal 20 is reduced down to less than 2 Torr, preferably less than 1 Torr, the connection line side ends of the branch pipes are heated by the acid hydrogen burner until they are fused to be closed and said branch pipes being removed.

Further, said quartz glass material composing said quartz glass body 6 is selected from high viscosity quartz glasses having a viscosity of $3.0 \times 10^{10}$ poise or more and more, preferably $3.1 \times 10^{10}$ to $4 \times 10^{10}$ poise. Said quartz glass material composing said quartz glass body 6 is required to have a stable shape retaining capacity at high temperatures and a heat resistant and deforming characteristic at a predetermined temperature which is a requisite to a support member of the rod-shaped heater 1.

Further, said quartz glass material composing said quartz glass tube 4 may be of similar material as that of the quartz glass material composing a quartz glass body 6, but low viscosity quartz glass having a viscosity in the range from 0.05 to 0.85 times the viscosity of the quartz glass body 6 is preferred and it is even more preferable that it is in the range of 0.35 to 0.55 times the quartz glass body 6.

In this way, the combination of a high viscosity quartz glass for said quartz glass body 6 and a specific low viscosity quartz glass for the quartz glass tube 4 eliminates the likelihood of excessive deformation at the time of fusion of both members and connecting portions left unfused such that it is possible to form a predetermined integral member.

Here, if the viscosity of the quartz glass to be used for the quartz glass tube 4 is smaller than that of the quartz glass to be used for the quartz glass 6 by 0.05 times, such low viscosity at the time of fusing operation causes a part of the quartz glass tube 4 to dangle into the grooves 6a of the quartz glass 6 to come into contact with the carbon wire heating element 2 accommodated in the grooves 6a.

As a result, carbon (C) of said quartz glass ($SiO2$) and that of said carbon wire heating element 2 reacts at the connection under high temperature condition to cause degradation of the heating element itself and the quartz glass in the grooves 6a causing heating irregularities in the longitudinal direction along the heating element 2, and durability may be lowered.

Therefore, it is preferable that the viscosity of the quartz glass used for the quartz glass tube 4 is 0.05 times or more that of the quartz glass used for the quartz glass body 6 and particularly, it is preferable that it is 0.35 times or more the quartz glass of the quartz.

If the viscosity of the quartz glass used for the quartz glass 4 is larger than the viscosity of 0.85 times or more that of the quartz glass used for the quartz glass body 6, a high temperature and a long hour is needed for perfect fusion and otherwise there is a high likelihood of the carbon wire degradation.

Therefore, the viscosity of the quartz glass of the quartz glass tube 4 is preferably 0.85 times or less than that of the quartz glass used for the quartz glass 6 and particularly, it is even more preferable if it is 0.5 times or less that of the quartz glass used for the quartz glass body 6.

In this connection, the fusing operation explained in the fourth embodiment may be applied to the first and third embodiments.

More specifically, the mechanical strength can be increased by fusing the large diameter quartz glass tube 4 to the small diameter quartz tube 3.

Figure 13:
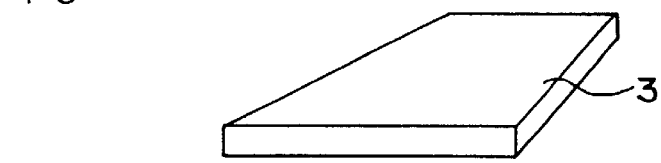
FIGS. 13a through 13d are views to show the manufacturing process of one modification of the second embodiment of the present invention relating to the rod-shaped heater.
Figure 13:
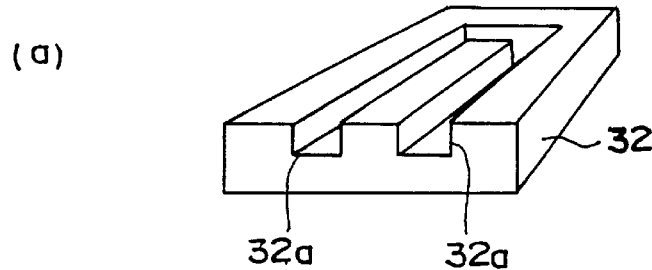
Figure 13:
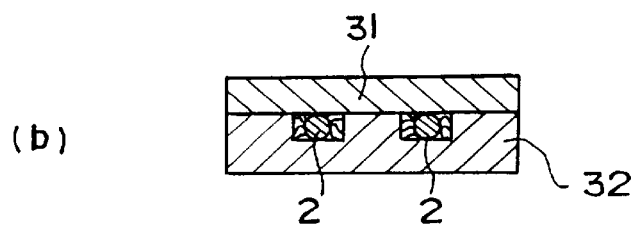
Figure 13:
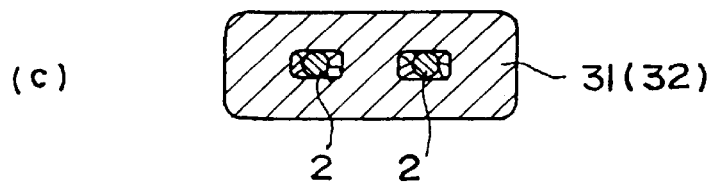
Figure 13:
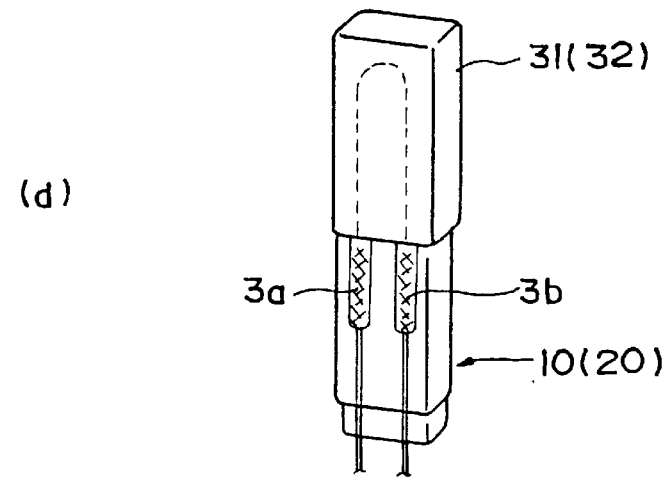

Further, the first flat quartz glass plate 31 shown in FIG. 13a and the second flat quartz glass plate 32 shown having hairpin-shaped grooves 32a in which the carbon wire heating element is accommodated are laid one the other as shown in FIG. 13b and, thereafter, said members are fused to each other such that the carbon wire heating element 2 is sealed into an integral member with the small diameter quartz glass tube 3a and 3b being secured to the opposite ends of said carbon wire heating element 2 by means of the wire carbon members A before the sealed terminal section 10 (20) having the pinch sealed tungsten connection lines 22a and 22b similar to the first and third embodiments is also fusion connected to form an elongated plate-like rod-shaped heater which is planar as shown in FIG. 13d.

The thus integrated elongated plate-like rod-shaped heater strengthens the heating section even more.

Next, the fifth embodiment of the invention will be explained with reference to FIG. 14.

Figure 14:
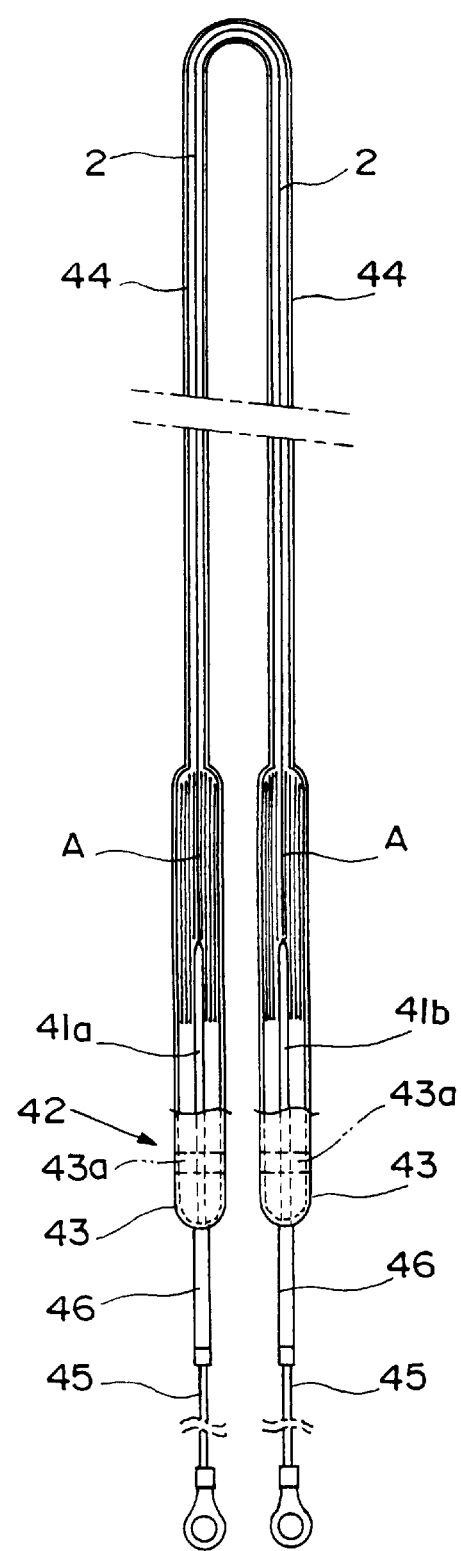
FIG. 14 is a cross section in part of the fifth embodiment of the present invention showing a rod-shaped heater.

In this connection, FIG. 14 is a cross section in part of the rod-shaped heater in the fifth embodiment.

The feature of this embodiment is in connection lines 41a and 41b being arranged in separate spaces.

More specifically, there are provided a pair of quartz glass tubes 43 constituting said sealing terminal section 42. Each quartz glass tube 43 is composed of a quartz glass section, a graded seal section, and a tungsten glass section 43a such that connection lines 41a and 41b are sealed at the tungsten glass section while said quartz glass section 43 is fused to a small diameter glass tube 44 sealing the carbon wire heating element 2.

Since the two quartz glass tubes 43 constituting the sealing terminal section 42 are thus separately provided to arrange the connection lines 41a and 41b in separate spaces, a glow discharge between the connection lines 41a and 41b is effectively forestalled. Further, since the quartz glass tubes 43 are composed of the quartz glass section, the graded seal section, and the tungsten glass section 43a, a possible damage due to a thermal expansion is minimized. It is also acceptable to further provide a large diameter glass tube for enclosing the small diameter glass tube 44 which seals the carbon wire heating element 2. Further, the diameters of the end portions of the small diameter glass tubes 44 which accommodate the wire carbon members A as shown in FIG. 14 may be sized larger in accordance with the number of the wire carbon members being increased. Further, the quartz glass tubes 43 constituting the sealing terminal section 42 may be both secured to one fixed member to strengthen the whole structure.

The sequence of manufacture of the rod-shaped heater according to the fifth embodiment is, in principle, as follows.

(1) The end portions of the tungsten connection lines 41a and 41b is subjected to overlaying by means of a molten tungsten rod.

(2) The connection lines 41a and 41b thus overlaid with tungsten are inserted into said quartz glass tube 43 constituting the sealing terminal section 42 where the portions overlaid with tungsten are fused to the tungsten glass sections 43a of the quartz glass tubes 43 after the positioning thereto.

(3) The end of the connection lines 41a and 41b are silver bladed or spark welded with lead wires 45. Thereafter, a thermally contracting tubes 46 are lifted from the lower ends of the lead wires 45 up to the ends of the connection lines 41a and 41b. Thereafter, the ends of the connection lines 41a and 41b and the connected portions between said connection lines 41 and 41b and the lead wire 45 are enclosed by said thermally contracting tubes 46 while being heated. In this way, the sealing terminal section 42 is completed.

(4) Next, a carbon wire heating element 2 is arranged within the small diameter glass tube 44. Further, the end portions of said small diameter glass tube 44 are charged with compressed wire carbon members A such that the end portions of the carbon wire heating element 2 is held between the thus charged wire carbon members A.

(5) Then, the open end of one of the quartz glass tube 43 constituting the sealing terminal section is fused to the open end of said quartz glass tube 44. (In this case, nitrogen gas is being supplied from a side pipe not shown while fusing is done by an acid hydrogen burner). Similarly, the open end of the other quartz glass tube 43 constituting the sealing terminal section is fusion connected to the open end of said quartz glass tube 44.

(6) Finally, the inside pressure of the quartz glass tube 44 and the sealing terminal section is reduced down to less than 2 Torr and preferably to less than 1 Torr by use of said not shown side pipe and then, the connection side end of said side pipe is heated by the acid hydrogen burner to seal before the side pipe is removed.

Next, the embodiment of the invention wherein the plate-like heater with reference to FIG. 15 will be explained.

Figure 15:
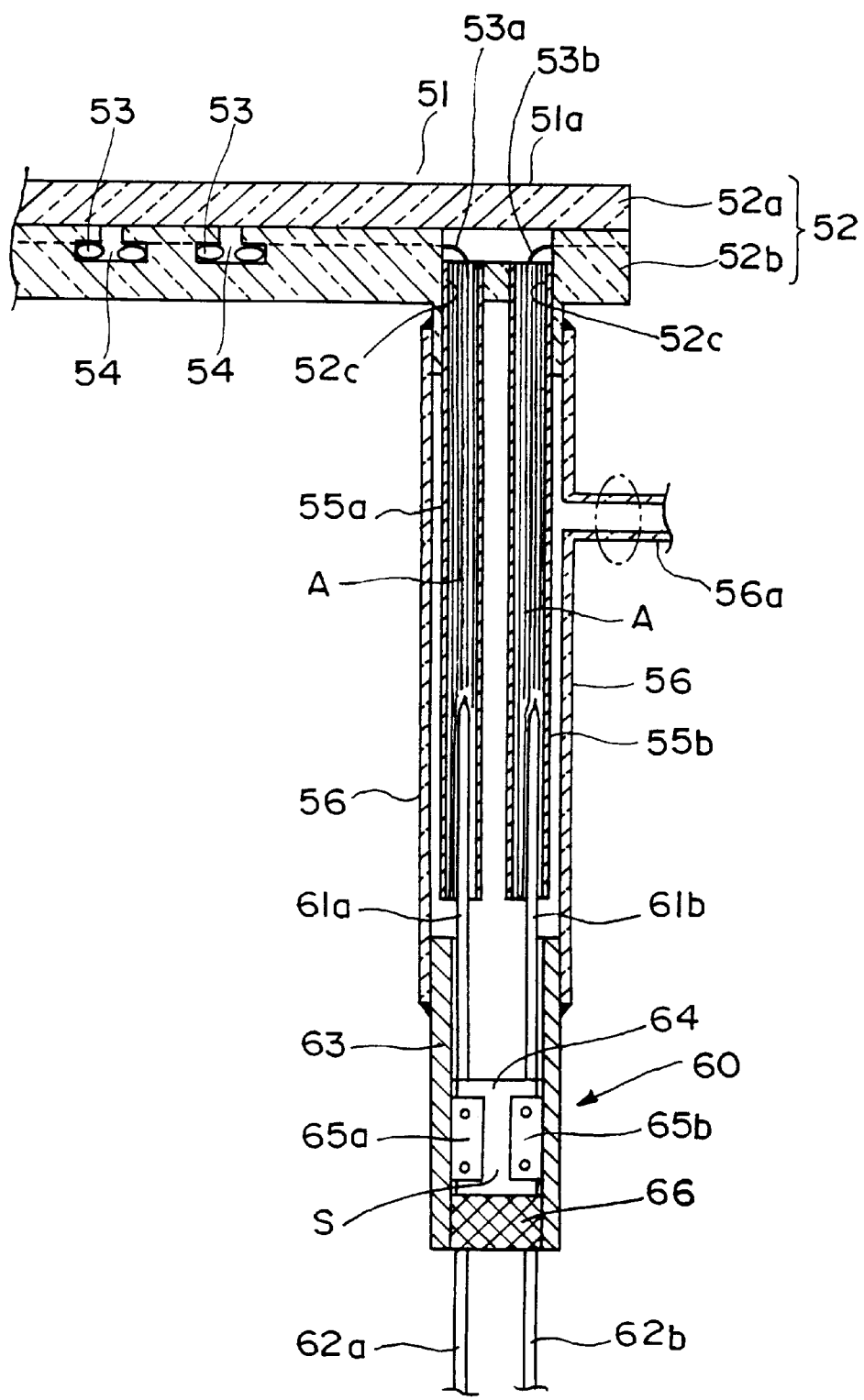
FIG. 15 is a cross section of a further embodiment of the present invention showing a plate-like heater.

In FIG. 15, a heater 51 has a heating face of a disc shape, wherein a carbon wire heating element 53 is sealed in a quartz glass support member 52.

For said carbon wire heating element 53, the one which is prepared by weaving a plurality of fiber bundles into a wire configuration is adopted, each fiber bundle being prepared of a plurality of carbon fibers. Said carbon wire heating elements 53 are arranged in a so-called zigzag configuration on one face of the quartz glass support member 52. However, the wiring arrangement may be changed freely and is not limited thereto.

Said quartz glass support member 2 is formed with substantially hollow spaces 54 at a peripheral portions thereof. Exept for the existence of said spaces 54, the quartz glass member 2 is fused into a substantially solid member.

Said quartz support member 52 is composed of a plate-like quartz glass member (main member) 52b having an upper face formed with grooves in which the carbon wire heating elements 53 are accommodated, and a plate-like quartz glass member (a sealing cover plate) 52a to play the role of a cover to seal said grooves from above.

In other words, the quartz glass support member 52 is prepared by fusing together at bond faces of said plate-like quartz glass member (main member) 52b and a quartz glass member (a sealing cover plate) 52a, after said carbon wire heating elements are arranged in said grooves, and the inside of said grooves are brought into a state of non-oxidizing atmosphere.

A concrete example of such carbon wire heating element 53, those prepared by binding about 350 pieces of fibers, each having a diameter of 5 through 15 μm, preferably 7 μm, into a fiber bundle and weaving nine (9) such fiber bundles into a knitted cord or a braid having a diameter of 2 mm.

Thus, it is ensured that a tension strength required for a heating element at a high temperature is assured with adhesion characteristics of the fibers being kept uniform in the longitudinal direction thereof, thus reducing the unevenness of heating in the longitudinal direction.

The reason for using a plurality of bundled carbon fibers each having a diameter of 5 through 15 μm is because a fiber of diameter less than 5 μm lacks sufficient strength to endure the weaving process into a heating element of a desired elongated shape. Further, such fibers are too fine to obtain a desired resistance unless too many strings of fibers are used, thus making use of such fibers unpractical.

On the other hand, there is a problem with carbon fibers having a diameter of more than 15 μm, which lacks resiliency and is not only difficult to weave if bound into plural bundles of carbon fibers, but also some of said bundled fibers can snap to remarkably lower the strength thereof.

In such a case, the weaving span of the carbon wire is 2 mm through 5 mm or thereabout while the surface fluffing of the carbon fibers is 0.5 through 2.5 mm high or thereabout.

In this connection, said "fluffing" is a part of broken carbon wires projecting from the outer surface thereof as shown by the numeral 3c in FIG. 9.

The combination of each carbon wire heating element and the sealing terminal to be explained later provides the structure in which said carbon wire heating element are in contact with said quartz glass support member by way of said fluffing such that the partial degradation at a high temperature is prevented to minimize the unevenness of heating in a longitudinal direction. As a result, it is possible to provide a compact heater which is excellent in subsurface heating uniformity and suitable for the manufacture of semiconductors.

In the heater 51 sealed with the heating element of the present invention, a plurality of carbon wire heating elements 53 may be used and if a plurality of such carbon wire heating elements are used, the quality thereof in terms of heating characteristics are stabilized even more.

From a view point of heating uniformity, stability in durability and avoidance of dust generation, high purity carbon fibers are preferred. Particularly in case where the heater 1 is used for heat treatments of wafers in the production process of the semiconductors, the amount of impurities in said carbon fibers is preferred to be less than 10 ppm in terms of ash contents (Japanese Industrial Standards JIS R 7223-1979). Further, less than 3 ppm impurity contents is even more preferable.

The combination of such carbon wire heating element and the sealing terminals to be explained later will prevent the thermal diffusion of impurities into each quartz glass member which constitutes said carbon wire heating element and the sealed terminal. As a result, devitrification and degradation of the quartz glass member is prevented such that the service life of the sealing terminal is prolonged.

Said carbon wire heating element is preferably prepared by binding 100 through 800 carbon fibers each having a diameter of 5 through 15 µm into a bundle. Three or more such bundles, preferably 6 through 13 such bundles, are preferably woven into a longitudinal configuration such as a wire or a tape.

If less than 100 carbon fibers are bound, 6 through 12 such bundles are insufficient for securing a predetermined strength and resistance. Therefore, the weaving process in which sufficient number of bundles are to be woven, is made difficult.

In addition, with a small number of bundles, woven bundles can come loose as a result of partial breakage thereof to such an extent it is difficult to maintain the configuration.

With more than 800 fibers, on the other hand, less bundles are required to obtain a predetermined resistance and it is difficult to maintain the woven wire configuration.

Further, said carbon wire heating element is preferably designed to have electrical resistance of 1 through 20 $\Omega$/m/piece at the temperature of 1,000° C.

The reason is that it is needed to match the heating element to the transformer capacity in a heating device for a general semiconductor manufacturing.

In other words, with the resistance being more than 20 $\Omega$/m/piece, it is impossible to have a long heater due to its large resistance, in which the heat between the terminals is lost to cause a temperature unevenness.

On the other hand, with the resistance being less than 1 $\Omega$/m/piece, it is required to have a longer heater more than necessary due to its small resistance. This makes it likely that a temperature unevenness can result due to the irregularity of structure and that of the ambient atmosphere often seen with a long heating element such as carbon wire, carbon tape or the like.

The electric resistance of said carbon wire heating element at the temperature of 1,000° C. is preferably set at 2 to 10 $\Omega$/m/piece in order to secure a high degree of reliability in terms of said characteristics.

The terminal lines 53a and 53b from said carbon wire heating element 3 are, for example, drawn out perpendicularly to the heater surface 1a from the opening 52c having a diameter of 10 mm formed in the main member 52b.

Said terminal lines 53a and 53b are accommodated in small diameter quartz glass tubes 55a and 55b, at whose end portions 55c, the terminal lines 53a and 53b are compressed by wire carbon members A to be accommodated therein.

More specifically, the terminal lines 53a and 53b of the carbon wire heating element 53 are compressed by a plurality of wire carbon members A arranged in parallel to the axial direction of the respective small diameter quartz glass tubes 55a and 55b at the end portions 55c thereof.

In this connection, said compressed accommodation is not limited to the end portions of the small diameter quartz glass tubes 5a and 5b but long wire carbon members A may be arranged along the entire length of said tubes. Said carbon wire members A may be of a material same as that of the first embodiment.

Further, there is provided a large diameter quartz glass tube 56 outside of said small diameter quartz glass tube 55a and 55b, one end of which is fused to hermetically enclose an opening 52c to guide the terminal lines 53a and 53b of the carbon wire heating element 53 to seal from outside.

In this connection, the flank of the large diameter quartz glass tube 56 is provided with a side pipe 56a to introduce nitogen gas for preventing the carbon wire heating element 53 from being oxidized. Said side pipe 56a may also be used for reducing the internal pressure of the heater and the terminal.

Now then, an explanation will be given to the sealed terminal 20.

Said sealed terminal 60 is comprised of internal connection lines 61a and 61b to be connected to terminal lines 53a and 53b accommodated in small diameter quartz glass tubes 55a and 55b; external connection lines 62a and 62b to be connected to a power source not shown; a quartz glass tube 63 having a diameter either to be inserted into or receive said large diameter quartz glass tube 56; a quartz glass body 64 accommodated to fit the inside wall of said quartz glass tube 63; molybdenum (Mo) foils 65a and 65b, which are conductive foils for electrical connection of internal and external connection lines retained around the outer surface of the quartz glass body 24; a plug member 66 to close the end of said quartz glass tube 63.

In this connection, said large diameter quartz glass tube 64 and quartz glass tube 63 may be made of an equal diameter and be fused together at butt ends thereof.

Further, said quartz glass body 64 may be solid or hollow.

Said internal connection lines 61a and 61b and external connection lines 62a and 62b may be made of molybdenum (Mo) or tungsten (W) rod with its diameter being sized 1 through 3 mm. The diameters of said internal connection lines 61a and 61b and said external connection lines 62a and 62b may be chosen as necessary provided that a diameter smaller than 1 mm is not preferable in view of high electrical resistance.

On the other hand, too large diameters are not preferable, either, because the size of the terminal itself becomes too large.

Said internal connection lines 61a and 61b have pointed tips such that said internal connection lines are easily connected to the terminal lines 63a and 63b compressed and accommodated within the small diameter quartz glass tubes 55a and 55b, by merely inserting it thereinto.

In this case, the insertion depth is preferably 10 mm or more to assure physical and electrical coupling to the terminals 3a and 3b.

Further, tip ends of the internal connection lines 61a and 61b and those of the external lines 62a and 62b are accommodated in grooves 24a formed in the outer surface of said quartz glass body 64 to retain said internal and external connection lines therein such that the outer surfaces of said accommodated internal and external connection lines will not protrude from the outer surface of said quartz glass body 64.

Further, said internal connection lines 61a, 61b and said external connection lines 62a, 62b are electrically insulated from each other by said quartz glass body when accommodated in said grooves 24a and electrically connected by said molybdenum (Mo) foils 65a and 65b which will be explained later.

Said molybdenum (Mo) foils 65a and 65b are attached to the outer surface of said quartz glass body 64 so as to extend therealong such that said internal connection lines 61a and said external connection lines 62a as well as said internal connection lines 61b and said external connection lines 62b are electrically connected.

Said molybdenum (Mo) foils 65a and 65b are spaced apart from each other by a distance S to avoid electrical short circuiting.

Although the molybdenum (Mo) foil are used for a conductive purpose, another material such as tungsten (W) foil may be used in place thereof, provided that molybdenum (M) foils are preferable in terms of resiliency.

Further, for a blocking member 66 to plug the end of said quartz glass tube 63, a cement member composed of pulverized alumina ($Al_2O_3$) is charged.

Said cement member is prepared by adding water to pulverized alumina ($Al_2O_3$) and dry setting it at the temperature of 200° C.

Said molybdenum (Mo) foils 25a and 25b react with oxygen or moisture at a temperature higher than 350° C. to be oxidized and at the time of such oxidization, the volume thereof expands.

Said plug member 66 prevents the molybdenum (Mo) foils 65a and 65b from expanding by blocking the outer atmosphere such that the quartz glass tube 63 is prevented from being broken.

As a plug member, resin or a cement using pulverized SiO2 may be used instead of said cement ($Al_2O_3$) member but it is preferable to use a cement member using alumina ($Al_2O_3$) as a main ingredient in view of heat resistance and for the purpose of preventing cracks from being formed when dried.

Next, the method of manufacturing the sealed terminal 60 will be explained.

First, a generation of gas is eliminated by a predetermined heat treatment before the molybdenum foils 65a, the internal connection lines 61a, and the external connection lines 62a are spot welded.

In other words, the external connection lines 62a, the internal connection line 61a, and molybdenum foil 65a, having an 8 mm width and a 35 $\mu$m thickness, are connected and secured.

In a similar fashion, the molybdenum (Mo) foil 65b, the internal connection line 61b and the external connection line 62b are spot welded.

Then, the thus connected external connection line 62a and the internal connection line 61a are assembled by being accommodated in the groove 64a formed in the outer periphery of the quartz glass member 64.

Then, the thus assembled quartz glass body 64 is inserted far into the quartz glass tube 63 formed longer than the final sealed terminal for easy degasification.

After the insertion, the quartz glass tube 63 is softened by heating with an acid hydrogen acid gas burner from outside thereof at a portion where said quartz glass member 64 is located.

At this time, since the inside pressure of said quartz glass tube 63 is reduced, the quartz glass tube 63 is press fitted to the quartz glass body 64 by the atmospheric pressure until it is fused.

Then, the plug member 66 is loaded to the end of the external connection line 62a of said quartz glass tube 63 to close After said plug member 66 is dried and set, degasification is conducted by means of a vacuum pump from above such that the inside of the quartz glass tube 63, which is formed slightly longer is made vacuum, becomes a vacuum.

The sealed terminal manufactured with the above method is free from a gas leakage between the internal connection line 21a and 21b and the external connection line 62a and 62b, which are thus separated.

Next, the manner in which the sealed terminal manufactured with said method is attached to the heater 51, in which the heating element is sealed, is explained.

1) First, while a nitrogen gas is injected through to flow into the side pipe 56a, the large diameter quartz glass tube 56 is weld attached to the main member 52b constituting the quartz glass support member 52.

At this time, an appropriate annealing treatment is conducted to prevent cracking.

2) The terminal lines 53a and 53b composed of plural carbon wires are drawn into the small diameter glass tube 55a and 55b with the aid of strings.

Then, said small diameter quartz glass tube 55a and 55b are inserted into attachment holes 52c in the main member 52.

In this connection, the carbon wire terminal lines 53a and 53b are guided into the small diameter quartz tubes 55a and 55b and compressed by the plurality of wire carbon members A within and all through the insides of the small diameter quartz tubes 55a and 55b.

Thereby, any generation of sparks are prevented effectively.

3) Each member is arranged as shown in FIG. 1 such that the large diameter quartz glass tube 56 is welded to the lower part of the main member 52b while oxidization of the carbon wire heating element 53 and the terminal lines 53a and 53b is prevented by injecting nitrogen gas thereinto nitrogen gas from the side pipe 56a.

4) The sealed terminal 60 manufactured in the manner as previously explained is inserted from below into the large diameter quartz glass tube 56, such that the internal connection lines 61a and 61b are inserted into said terminal lines 53a and 53b for electrical connection.

5) Then, nitrogen gas is injected thereinto from the side pipe 56a while the large diameter quartz glass tube 56 and the sealed terminal 60 is fused together at connections thereof for attachment of the sealing terminal.

6) Thereafter, vacuum pumping is conducted from said side pipe 56a to reduce the pressure inside the heater.

Thereafter, said side pipe 56a is subjected to a flame fusing operation to seal the heater and then the side pipe is removed, thus completing the attachment of the sealed terminal 60.

The embodiments in the foregoing, glass was explained as a quartz glass but other types of glasses including high silica glass, borosilicate glass, aluminosilicate glass, soda-lime glass, lead glass or the like may be used in accordance with objects of use. Said glasses may be used, for example, as a material for a heater which heats the various solutions used for wet etching or grinding processes and control them at a low temperature, for example, below 100° C.

As explained in the foregoing, since the carbon wire heating element is used, it is possible to prevent metallic pollution of the cleaning agent or the grinding agent even if used for semiconductor manufacturing as well as assuring its mechanical strength to withstand the damage thereto even if it is directly dipped into the storage tank containing the cleaning agent or the grinding agent.

Particularly, the structure in which the carbon wire heating element is enclosed in an evacuated space by the predetermined quartz glass body makes more rapid temperature control possible while making the uniform heating in the longitudinal direction of the rod-shaped heater, thus providing a rod-shaped heater having a longer service life.

What is claimed is:

1. A heater comprising
   a large diameter glass tube;
   a carbon wire heating element sealed in said large diameter glass tube and having opposite ends;
   a small diameter glass tube section charged with compressed wire carbon members, said compressed wire carbon members holding said opposite ends of the carbon wire heating element therebetween; and
   a sealing terminal section having connection lines for power supply held between said carbon wire members, said connection lines and said carbon wire heating element being electrically connected to each other by way of said wire carbon members.

2. A heater comprising
   a carbon wire heating element having opposite ends;
   a small diameter glass tube section charged with compressed wire carbon members, said compressed wire carbon members holding said opposite ends of the carbon wire heating element therebetween such that said small diameter glass seals carbon wire heating element therein; and
   a sealing terminal section having connection lines for power supply held between said carbon wire material, said connection lines and said carbon wire heating element being electrically connected to each other by way of said wire carbon members.

3. A heater as set forth in claim 1, wherein said large diameter glass tube and said small diameter glass tube are of formed of quartz glass.

4. A heater as set forth in claim 1, wherein said wire carbon members and said carbon wire heating element are held in a compressed state to extend substantially in parallel to an axis of said small diameter glass tube section.

5. A heater as set forth in claim 4, wherein each of said wire carbon members and said carbon wire heating element is prepared by binding a plurality of carbon fibers into a carbon fiber bundle and weaving a plurality of such carbon fiber bundles into a knitted cord or a braid.

6. A heater as set forth in claim 1, wherein said sealing terminal section is composed of a glass tube including a glass portion, a graded seal portion, and a tungsten glass portion, said connection lines being pinch sealed at a pinch sealed portion, said glass portion being fused to said large diameter glass tube.

7. A heater as set forth in claim 6, wherein said glass portion is formed of quartz glass.

8. A heater as set forth in claim 1, wherein said sealing terminal section is composed of internal connection lines electrically connected to said carbon wire heating element; external connection lines for power supply; a glass body formed with a plurality of grooves to receive said respective internal and external connection lines; conductive foils to electrically connect said internal and external connection lines; a glass tube to receive said internal and external connection lines such that said internal and external connection lines extend at one ends thereof out of said glass body, said glass body having an outer surface fusion connected to said glass tube; and a plug member to close one end of said glass tube, said glass body being fusion connected to a large diameter glass tube at the other end thereof.

9. A heater as set forth in claim 7, wherein said glass member is formed of quartz glass.

10. A heater as set forth in claim 1, wherein said small diameter glass tube section integrally has a hairpin-shaped or spiral small diameter glass tube sealing said carbon wire heating element therein.

11. A heater as set forth in claim 10, wherein said small diameter glass tube section has a hairpin-shaped or spiral small diameter glass tube sealing said carbon wire heating element therein, said small diameter glass tube section and said small diameter glass tube being enclosed by said large diameter tube.

12. A heater as set forth in claim 1, wherein said small diameter glass tube charged with the compressed wire carbon members is provided integrally or separately beneath said solid glass body formed with grooves to receive said carbon wire heating element, said solid glass body receiving said carbon wire heating element at its outer surface thereof and said small diameter glass tube being enclosed by a large diameter glass tube, said solid glass body having an outer surface to be connected to said large diameter glass tube through fusion.

13. A heater as set forth in claim 12, wherein said large diameter glass tube, said small diameter glass tube and said solid glass body are formed of quartz glass.

14. A heater as set forth in claim 1, wherein said small or large diameter glass tube is composed of a first flat glass plate formed with grooves to receive said carbon wire heating element therein and a second flat glass body to be fused to said first flat glass body to close said groove.

15. A heater as set forth in claim 1, wherein said sealing terminal section includes two separate glass tubes, each having a glass portion, a graded seal portion, and a tungsten glass portion, said connection lines being sealed in said tungsten glass portion, said glass portion being fused to said small diameter glass tube or a large diameter glass tube which encloses said carbon wire heating element.

16. A heater as set forth in claim 15, wherein said glass tube and said glass portion are formed of quartz glass.

* * * * *